(12) United States Patent
Jones et al.

(10) Patent No.: US 6,885,954 B2
(45) Date of Patent: Apr. 26, 2005

(54) SEQUENCE TIME DOMAIN REFLECTOMETRY USING COMPLEMENTARY GOLAY CODES

(75) Inventors: Keith R. Jones, Irvine, CA (US); Gilberto Isaac Sada Treviño, Irvine, CA (US); Ragnar H. Jonsson, Reykjavik (IS); William W. Jones, Aliso Viejo, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 47 days.

(21) Appl. No.: 10/465,064

(22) Filed: Jun. 18, 2003

(65) Prior Publication Data

US 2004/0019443 A1 Jan. 29, 2004

Related U.S. Application Data

(63) Continuation-in-part of application No. 10/095,825, filed on Mar. 11, 2002, which is a continuation-in-part of application No. 09/810,932, filed on Mar. 16, 2001.

(51) Int. Cl.[7] .............................................. G06F 19/00
(52) U.S. Cl. ........................................ 702/79; 356/73.1
(58) Field of Search .......................... 702/79, 189, 190; 385/24, 88, 89–91; 356/73.1; 324/531, 533, 534; 714/25

(56) References Cited

U.S. PATENT DOCUMENTS

| | | |
|---|---|---|
| 4,719,643 A | 1/1988 | Beeman |
| 4,947,425 A | 8/1990 | Grizmala et al. |
| RE34,972 E | 6/1995 | Horiguchi et al. |
| 5,570,217 A | 10/1996 | Fleuren |
| 5,621,518 A | 4/1997 | Beller |
| RE35,607 E | 9/1997 | Nagamune et al. |
| 5,699,402 A | 12/1997 | Bauer et al. |
| 5,884,231 A * | 3/1999 | Perdue et al. .................. 702/28 |
| 6,028,661 A | 2/2000 | Minami et al. |
| 6,075,628 A | 6/2000 | Fisher et al. |
| 6,512,610 B1 | 1/2003 | Minami et al. |
| 6,534,997 B1 | 3/2003 | Horishita et al. |
| 6,542,228 B1 | 4/2003 | Hartog |
| 6,547,453 B1 | 4/2003 | Stummer et al. |
| 2002/0114383 A1 | 8/2002 | Belge et al. |

* cited by examiner

*Primary Examiner*—Edward Raymond
(74) *Attorney, Agent, or Firm*—Weide & Miller, Ltd.

(57) ABSTRACT

A method and system for performing sequence time domain reflectometry over a communication channel to determine the location of line anomalies in the communication channel is disclosed. In one embodiment, the system generates a sequence signal and transmits the sequence signal over an optical channel. The system receives one or more reflection signals over the optical channel and performs reflection signal processing on the reflection signal. In one embodiment, the optical reflection is transformed to an electrical signal and correlated with the original sequence signal to generate a correlated signal. The time between the start of the reflection signal and a subsequent point of correlation and the rate of propagation reveals a line anomaly location. A circulator, beam splitter, or any other similar device may direct the reflection signal to the apparatus configured to perform reflection signal processing.

6 Claims, 28 Drawing Sheets

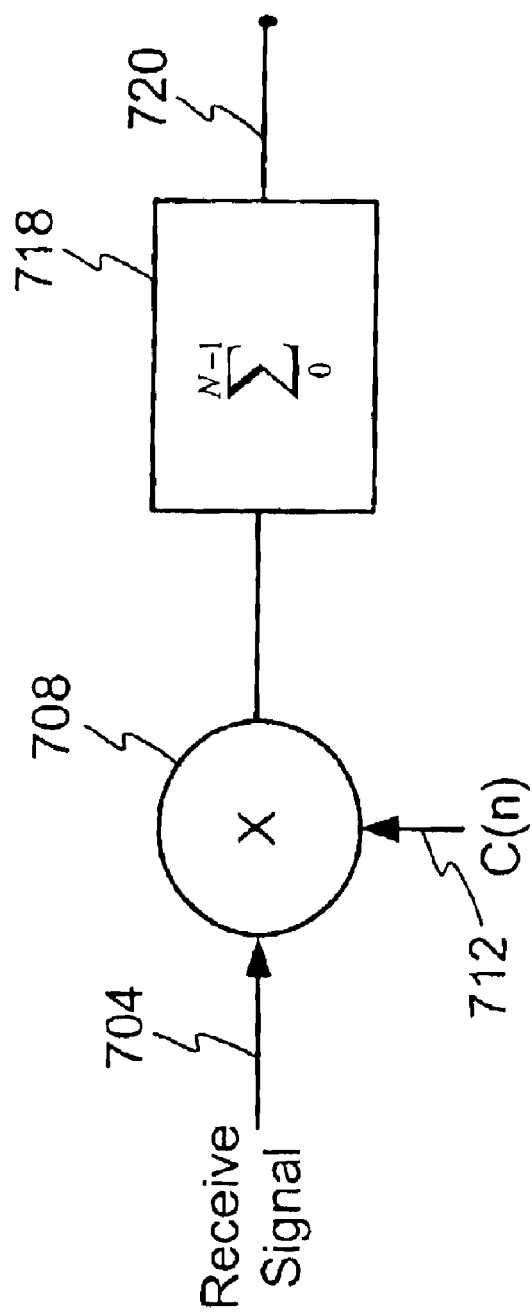

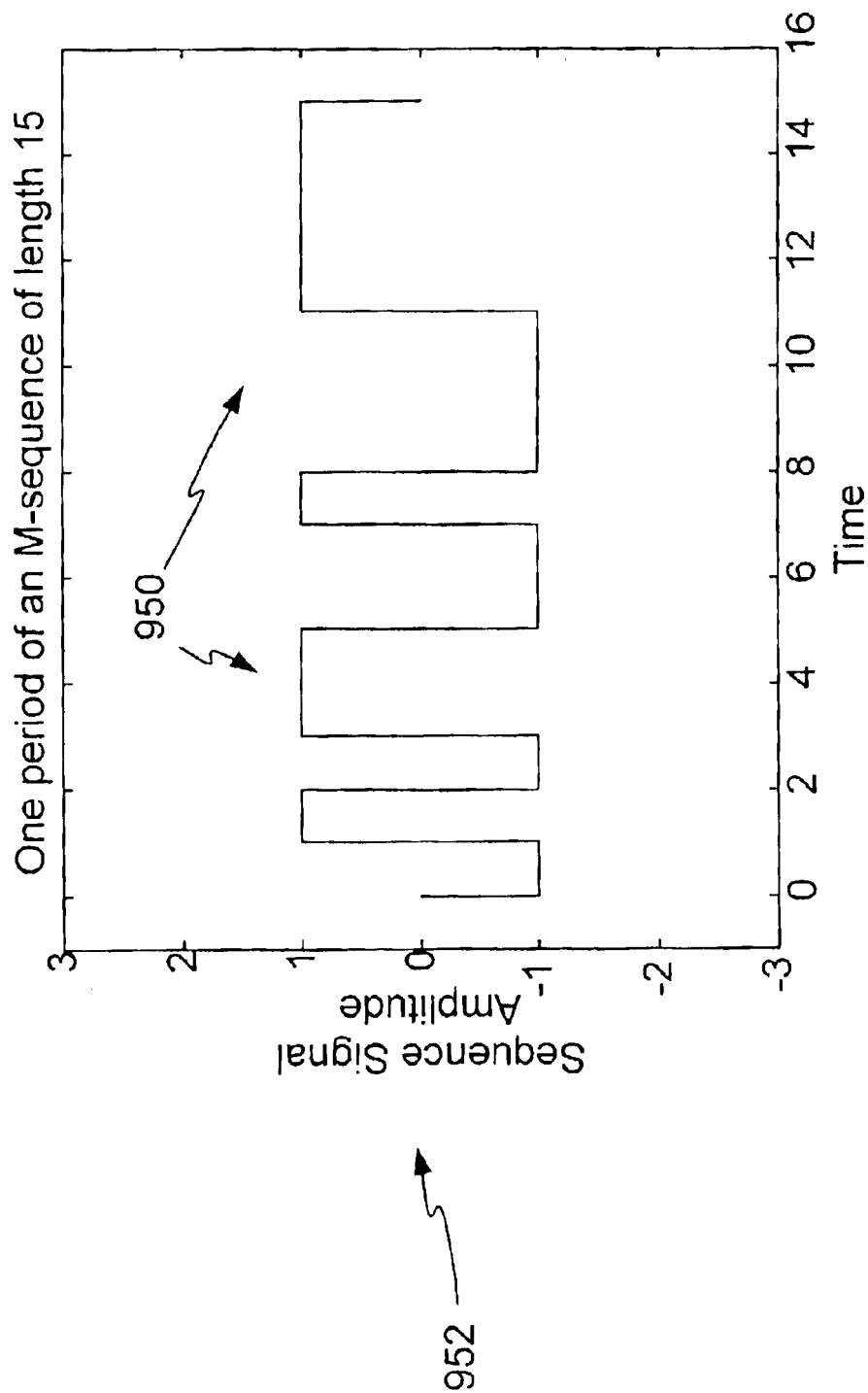

SEQUENCE TIME DOMAIN REFLECTOMETRY USING COMPLEMENTARY GOLAY CODES

This application is a continuation-in-part of application Ser. No. 10/095,825, entitled Optical Time Domain Reflectomentry, filed Mar. 11, 2002, which is a continuation-in-part of application Ser. No. 09/810,932, entitled Method and Apparatus for Transmission Line Analysis filed Mar. 16, 2001.

FIELD OF THE INVENTION

This invention relates generally to communications and in particular to a system and method for analyzing a transmission line.

RELATED ART

Historically, new communication technologies are continually being introduced to improve the ease and rate at which data can be exchanged between remote locations. One factor that must be considered when communicating electronic data is the medium over which the data will travel. This is often referred to as determining the channel quality, line characteristics, line transfer function, insertion loss, or channel impulse response. Numerous different types of conductors are utilized to conduct communication signals. One example medium that is commonly installed throughout the world is twisted pair conductors as are traditionally used to provide telephone service between a central office telephone facility and a residence or business.

The medium must be considered because the medium and its condition can affect the rate at which communication may occur. For example, digital subscriber line (DSL) technology utilizes twisted pair conductors. The rate at which systems using the DSL standards may operate is determined in part by the electrical characteristics of the twisted pair between a transmitting device and a receiving device. The factors that control the rate of communication may include the distance between the receiver and transmitter, presence of bridge taps or load coils, the quality of the twisted pair, the quality of connections to the twisted pair, and the amount of noise that the twisted pair picks up, such as crosstalk noise. As data communication speeds increase, the quality of the line and the presence of line anomalies become of greater importance.

It may be desirable to determine characteristics of the line prior to communicating data so that a data transmission rate may be determined or so that it may be determined if the line is able to support communications under a particular standard. For example, if certain line anomalies exist between a first communication unit and a second communication unit, it is desirable to learn of these anomalies and their effect on communication through the line. Moreover, it is desirable to determine the location of the anomalies so that repair or removal of the anomaly may occur. In the particular case of bridge taps and load coils, service technicians are dispatched to locate and remove the bridge tap or load coil. The dispatch of service technicians is expensive and hence, the less time the service technician must spend locating the line anomaly, the lower the cost of the dispatch. Therefore, the more accurately the anomaly location is identified, the less costly the service dispatch because the technician may more rapidly find and fix the anomaly.

One prior art method of line analysis, such as for evaluating the effects of or identifying the location of line anomalies comprises transmission of a high power pulse on the line. Impedance irregularities in the line cause a reflection or echo when encountered by the pulse. Time information is used to determine the location of the anomaly.

This method of line analysis suffers from numerous disadvantages. One disadvantage arises as a result of the necessary, but undesirable, use of a high power pulse. Transmission of a high power pulse on a line disrupts communication and operation of the other pairs in the binder by creating crosstalk between pairs. Another disadvantage of this prior art method arises because of the available echo processing methods. The in-use pairs in the binder with the line being tested create crosstalk in the line being tested. This limits the detectability of weak return echoes which translate into a limitation on the ability of prior art pulse system to accurately analyze the distant end of a long line. Yet another drawback associated with the prior art method of high power pulse reflection analysis is the limited platforms available to generate a high power pulse. As a result, pulse test equipment must be implemented as a separate piece of test equipment and may not be an integrated circuit. This increases the cost of testing by requiring a separate piece of test equipment and can make its use inconvenient.

In the case of line analysis of an optical fiber or cable, the prior art is limited by the magnitude or power of a pulse that may be sent over the fiber. As a result, the resolution and strength of the system is undesirably limited. The method and apparatus described and claimed below overcomes these drawbacks.

The invention overcomes the disadvantages of the prior art by providing a method for apparatus for sequence time domain reflectometry.

SUMMARY

In one embodiment, the invention comprises a line probe signal and method of generating the same for use in determining line characteristics. In one embodiment, the invention comprises a method and apparatus for processing a line probe signal to determine channel characteristics, such as to determine the location and type of one or more line anomalies. Line anomalies may comprise open circuit, short circuit, bridge taps, load coils, moisture on the line, or any other aspect that creates an impedance mismatch.

In one embodiment, a method for performing time domain reflectometry on a communication channel comprises generating a sequence signal and transmitting the sequence signal over a communication channel. In one embodiment the sequence signal has an autocorrelation function, which approximates a Kronecker delta function. The communication channel may comprise any channel including, but not limited to, fiber optical cable, coaxial cable, power transmission line, network line Ethernet, twisted pair or any channel capable of conducting data. The length of the line or channel being analyzed may range from fractions of a millimeter to thousands of miles. Next, the system receives one or more reflection signals from the communication channel in response to the transmission of the sequence signal. After receipt of the reflection signal, the system correlates the reflection signal with the sequence signal to generate a correlated signal. Due to the autocorrelation properties of the sequence signal, the correlated signal is a linear combination of the near-end echo and the echoes from one or more anomalies. Next, the system may retrieve a template signal. The template signal corresponds or is representative of the near-end echo in the reflection signal. After retrieving the template signal, the system aligns the template signal and the correlated signal to determine a point of alignment. The point of alignment may comprise when the two signal are most similar. Once aligned, the method subtracts the template signal from the correlated signal to remove near-end echo from the correlated signal. Other aspects of the reflection signal may be removed other than n ear-end echo. Next, the system measures a time interval between the point of alignment and a subsequent peak in the correlated signal. This reveals the amount of time it took for the signal to propagate to a line anomaly and for the reflection signal to return to the receiver. When the propagation time is determined, the system multiplies the time interval by the rate of propagation of the sequence signal through the communication channel to obtain a distance to a line anomaly. The rate of propagation for an electrical signal through a channel is generally known for different channel mediums. In one embodiment the method of the invention further includes dispatching a service technician or other personnel to fix the line anomaly.

In various other configurations or embodiments, the template signal may be measured or created by correlating the reflection from a long cable of the type to be tested and known to be free of a nomalies or the template may be derived from a detailed circuit analysis of the transceiver and the line interface. In one embodiment, the sequence signal is transmitted at a power level that does not introduce crosstalk into other communication channels.

In another variation or embodiment, the method of operation also performs a circular rotation of the sequence signal to create a rotated sequence signal and transmits the rotated sequence signal over the communication channel. A rotated reflection signal is received and correlated with the rotated sequence signal that was transmitted to create a rotated reflection signal. This correlated rotated signal is aligned with the correlated signal and combined with the correlated signal to reduce or remove correlation artifacts on the correlated signal.

To realize this method of operation, various different configurations of hardware and/or software may be utilized. In one embodiment, a system performs sequence time domain reflectometry to determine the location of impedance mismatches on a channel being configured to communicate data using a digital subscriber line standard. This embodiment comprises a sequence generator configured to generate a maximal length sequence signal connected to a transmitter that is configured to transmit the sequence signal on a channel. This causes the sequence signal to propagate through the channel, the channel being analyzed to determine the location of impedance mismatches that may affect data transmission. A receiver is configured to receive one or more reflections that result from the sequence signal encountering impedance mismatches as it propagates through the channel. A correlator connects to the receiver and correlates the received signal, which is comprised of one or more reflections, with the sequence signal to generate a correlated signal, which is the linear combination of the impulse responses of the transmission paths to the one or more anomalies. Also included in this configuration is a processor, other hardware or software, configured to determine the time period between a beginning of the sequence signal transmission as determined from the peak of the n ear-end echo response and the peak of the echo response from the one or more anomalies. The processor, other hardware or software, is configured to calculate a value corresponding to a channel length between the system and an impedance mismatch.

The invention can be implemented from only one end of the channel, such as when access is possible or convenient to only one end, or when invention may be performed at any point along the channel. The invention may be used to classify the line or channel into a data transmission rate group, a cost of service group, or simply whether or not to use the line for high speed data communication. In one embodiment the distortion of the pulse by the transmission medium may be analyzed to discriminate between various types of anomalies.

In one or more other embodiments, the system may include various other features or aspects. In one embodiment, the system is embodied on a communication device configured to communicate data using a digital subscriber line standard. In one embodiment the sequence generator comprises a tapped delay line.

In one embodiment, the invention utilizes an echo cancellation method of operation to perform time domain reflectometry processing. A method of operation based on this alternative embodiment includes processing a reflection signal resulting from transmission of a sequence of bits over a channel to determine the location of line anomalies. This occurs by providing the generated sequence (not correlated with the transmit sequence) to a prediction module, which, in one embodiment, is comprised of a finite impulse response, adaptive filter. The coefficients of the prediction filter are adapted such that the output of the prediction filter approximates the received reflection sequence when the transmit sequence is applied to the input of the filter. When this adaptive procedure converges, the coefficients of the adaptive filter are an estimate of the linear combination of the near-end echo response and the responses from the one or more anomalies This method of operation may further include analyzing the coefficient values when the prediction filter output generally resembles the reflection signal to determine the location of impedance mismatches on the channel. In one particular embodiment the prediction filter comprises a finite impulse response filter. In one embodiment the sequences of bits may comprises a sequence selected from the group of sequences consisting of a maximal length sequence, a Barker code, or a Kasami sequence. It should be noted that comparing may include subtracting the prediction filter output from the reflection signal.

In various embodiments the method and apparatus as contemplated by the invention may be configured to analyze an optical fiber. In such an embodiment the system includes an optical driver configured to transform the sequence signal into a signal suitable for driving an optical signal generator and an optical generator configured to receive the output of the optical driver and generate an optical signal. An optical interface is provided to route the optical signal from the optical generator to an optical fiber and output an optical reflection received over the optical fiber. An optical detector is included and is configured to receive the optical reflection from the optical interface and convert the optical reflection to a reflection signal in electrical form.

In one embodiment a near-end echo reduction module configured to remove near-end echo from the reflection signal. In another embodiment the optical generator comprises a light emitting diode or a laser.

In yet another embodiment an optical sequence time domain reflectometry system is provided that comprises a sequence signal source configured to provide a sequence signal to an optical transmit system. The optical transmit system is configured to receive the sequence signal from the sequence signal source, convert the sequence signal to an optical signal, and transmit the optical signal through an optical fiber. Such a system may further include an optical receive system configure to receive an optical reflection signal and convert the optical reflection signal to an electrical reflection signal and a correlator configured to receive the electrical reflection signal and correlate the electrical reflection signal with the sequence signal.

In one embodiment this system further includes an optical interface positioned to interface the optical transmit system and the optical receive system with the optical fiber. The system may be configured within a communication device or test equipment. The optical interface may comprise a circulator or a beam splitter.

A method may also be provided for determining the location of a line anomaly in a fiber optic cable. The method may includes the steps of obtaining a sequence signal, converting the sequence signal into a light signal, transmitting the light signal through an optical fiber, and thereafter receiving and directing a reflected light signal to an optical detector. Next, the method converts the reflected light signal to a reflection sequence in electronic form, correlates the reflection sequence with the sequence signal to obtain a correlated signal, and analyzes the correlated signal to determine a point of correlation. Thereafter, the method calculates a duration of propagation of the sequence signal through the optical fiber and calculates a location of a line anomaly based on the duration of propagation and a rate of propagation.

In one embodiment the steps of receiving and directing a reflected light signal to an optical detector is performed by a beam splitter. In one embodiment the method may further comprise subtracting a near-end echo template signal from the correlated signal to remove an unwanted point of correlation caused by near-end echo. This method may be performed by test equipment or communication equipment.

As an alternative, the method may analyze an optical fiber by first transmitting a sequence signal through an optical fiber, then receiving a reflection signal from the optical fiber and correlating the reflection signal to create a correlated signal and thereafter, processing the correlated signal to obtain information regarding the optical fiber. In this method the processing may include subtracting a correlated near-end echo signal form the correlated signal to remove the point of correlation created by the near-end echo so that a point of correlation may be identified. Based on this point of correlation the method calculates a propagation duration between transmission of the sequence signal and receipt the portion of the reflection that creates the point of correlation and multiplies the propagation duration with a rate of propagation of the sequence signal through the optical fiber. This allows one to determine information concerning a distance to a location in the optical fiber that created the point of correlation. This method may occur multiple times to obtain numerous reference points.

The method and apparatus of the invention may also be realized as a computer program product comprising a computer useable medium having computer program logic recorded thereon for optical fiber analysis. One such embodiment of such a configuration comprises computer program code logic configured to generate a sequence signal and an optical generator configured to transmit the sequence signal, in optical form, over an optical fiber. An optical receiver detects an optical reflection and converts the optical reflection to a reflection signal in electrical format. Additional computer program code logic is configured to correlate the reflection signal with the sequence signal to create a correlated signal while other computer program code logic is configured to analyze the correlated signal to determine a portion of the correlated signal having a maximum magnitude. Further computer program code logic determines a distance to a line anomaly based on a time of receipt of the portion of the correlated signal having a maximum magnitude.

Additional computer program product may be configured to analyze the reflection signal to determine the type of line anomaly that is creating the reflection signal. This embodiment may include an optical interface configured to direct a portion of the sequence signal to the optical detector and a portion of the sequence signal to the optical fiber. In one embodiment the computer program code logic configured to determine a distance to a line anomaly comprises computer program code logic configured to multiply the time duration for the sequence signal to travel to the line anomaly by one-half the rate of propagation for the sequence signal.

In yet another embodiment, the method and apparatus contemplated by the invention comprises a method for processing a reflection signal to obtain information about an optical fiber. This method monitors for a reflection signal received over an optical fiber. The reflection signal is generated by transmission of an original signal. Upon receipt, the method correlates the reflection signal with the original signal to generate a correlated signal and analyzes the correlated signal for points of correlation to determine if line anomalies are present in the optical fiber. In addition, the method may further include analyzing the correlated signal to determine the type of line anomaly present in the optical fiber.

The scope is not limited to only the described combinations but is intended to cover any various combination as might be contemplated after reading the specification and claims. Hence an embodiment may include one feature or element or any combination or number of features or elements.

Other systems, methods, features and advantages of the invention will be or will become apparent to one with skill in the art upon examination of the following figures and detailed description. It is intended that all such additional systems, methods, features and advantages are included within this description, are within the scope of the invention, and are protected by the accompanying claims.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

FIG. 7 illustrates block diagram of an example configuration of a correlation unit.

FIG. 9 illustrates a plot of an example sequence signal.

DETAILED DESCRIPTION

Figure 1:
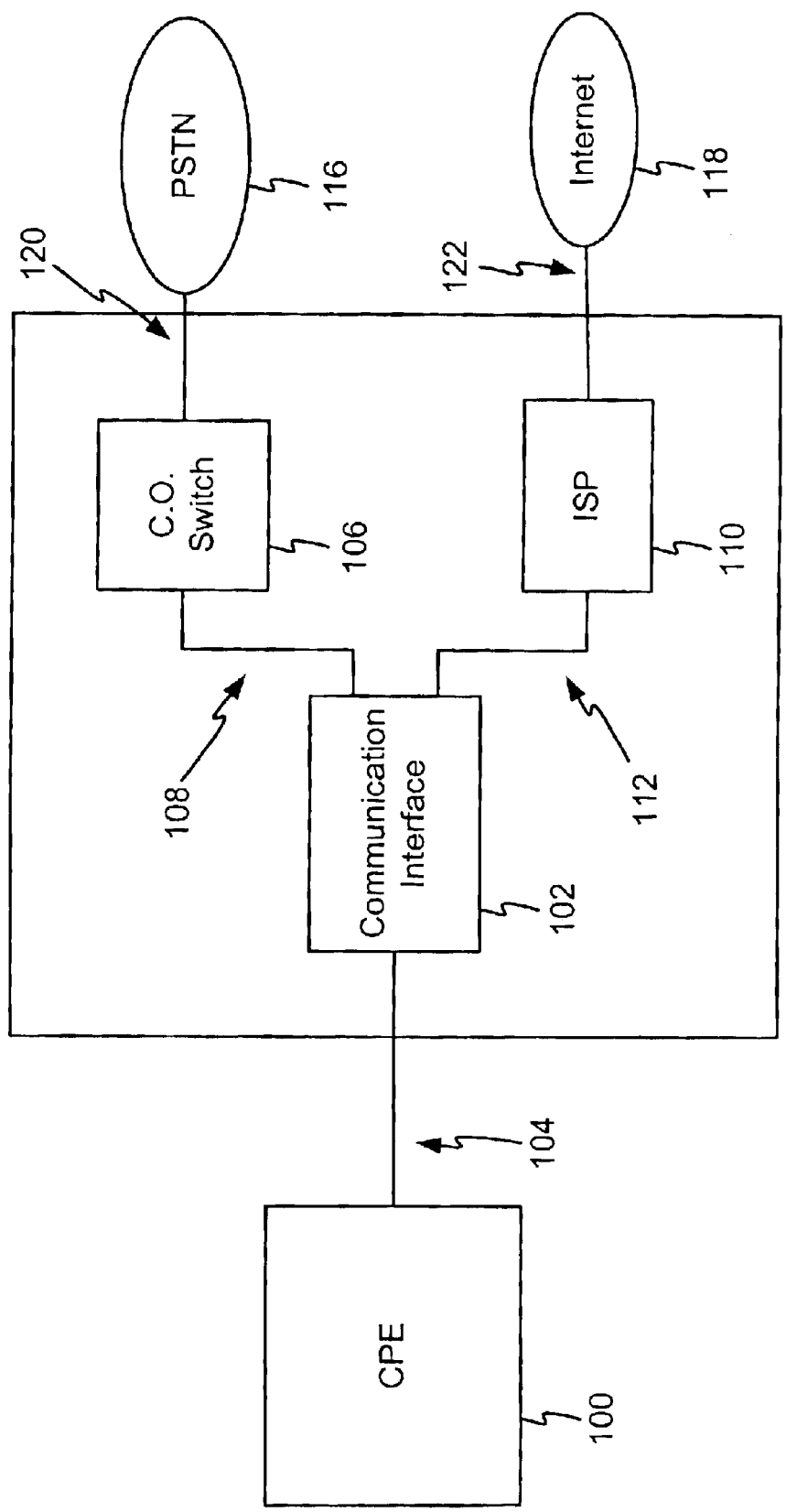
FIG. 1 is a block diagram of an example environment of use of the invention.

FIG. 1 illustrates an example environment for use of the invention. The example environment shown in FIG. 1 is provided for purposes of discussion and is not in any way intended to limit the scope or breadth of the invention. It is contemplated that the invention may find use in a plurality of other environments, such as any environment where it is desired to obtain information regarding line characteristics for the purposes of communication over the line, line repair or line classification. The line to be probed may comprise any type of conductor or channel including, but not limited to, a twisted pair conductor, coaxial cable, Ethernet, an optical channel, or a radio frequency waveguide.

FIG. 1 illustrates customer premise equipment (CPE) 100 in communication with a communication interface 102 over a first line 104. The CPE 100 comprises any communication device that is generally located remote from the communication interface 102 and configured to facilitate communication over the first line 104. In one embodiment, the CPE 100 comprises a communication modem or communication device located at a business or residence. The CPE 100 may comprise, but is not limited to, any device operating under the digital subscriber line (DSL) standard, any voice band modem, cable modem, wireless modem, power line modem, or any other device configured to perform digital or analog communication. It is contemplated that contained in the CPE 100 and the communication interface 102 there is a receiver and transmitter configured to send and receive data over the line 104.

The first line 104 may comprise any communication medium intended to carry communication signals. In various embodiments the first line 104 comprises, but is not limited to, one or more conductors of a twisted pair of conductors, coax cable, power line, optical cable. Although the first line 104 is shown as a single line, it should be understood that the line 104 may comprise any configuration or number of conductors, optical paths, or other such paths. Other lines, channel, or paths or conductors shown throughout the figures may likewise comprise any configuration or number of conductors, optical paths, or other such paths.

In this embodiment, the communication interface 102 comprises any communication equipment configured to communicate with the CPE 100 over the first line 104. With regard to the DSL standard, the communication interface 102 may comprise a digital subscriber line access multiplexer (DSLAM). A DSLAM is configured to facilitate communication over the first line 104 between the CPE 100 and a central office (CO) switch 106 and an Internet Service Provider (ISP) 110. The DSLAM may include modems or other communication devices.

Communication with the CO switch 106 occurs over a second line 108 while communication with the ISP 110 occurs over a third line 112. The communication interface 102 appropriately routes certain voice communication from the CPE 100 to the CO switch 106 while appropriately routing certain data communication from the CPE to the ISP 110. As shown, the CO switch 106 may connect to the PSTN 116 thereby serving as a switching and routing service for telephone, facsimile, or data calls. The ISP 10 may connect to the Internet 118 to provide access to a plurality of other networked computers.

It is contemplated that the various embodiments of the invention may be used to evaluate the characteristics of the first line 104, the second line 108, the third line 112, or lines 120 and 122 to thereby determine characteristics of the line, such as but not limited to the location of line anomalies that may effect data transmission. It is desired to obtain the highest data rate supportable by the lines 104, 108, 112, 120, 122 so that a maximum amount of data may be transferred in a minimum amount of time with the fewest number of errors. This enables more rapid upload, downloads, and greater and more reliable use of the lines 104, 108, 112, 120, 122. It is also contemplated the invention may be practiced at any location in the communication system. In one preferred embodiment, the invention is integrated with modems at the communication interface 102, the C.O. switch 106, or the communication interface 102. The invention may also be used to determine a line characteristics for each leg or path for symmetrical communication (identical or similar data transmission rates between devices) or asymmetrical communication (different data transmission rates between devices).

Figure 2A:
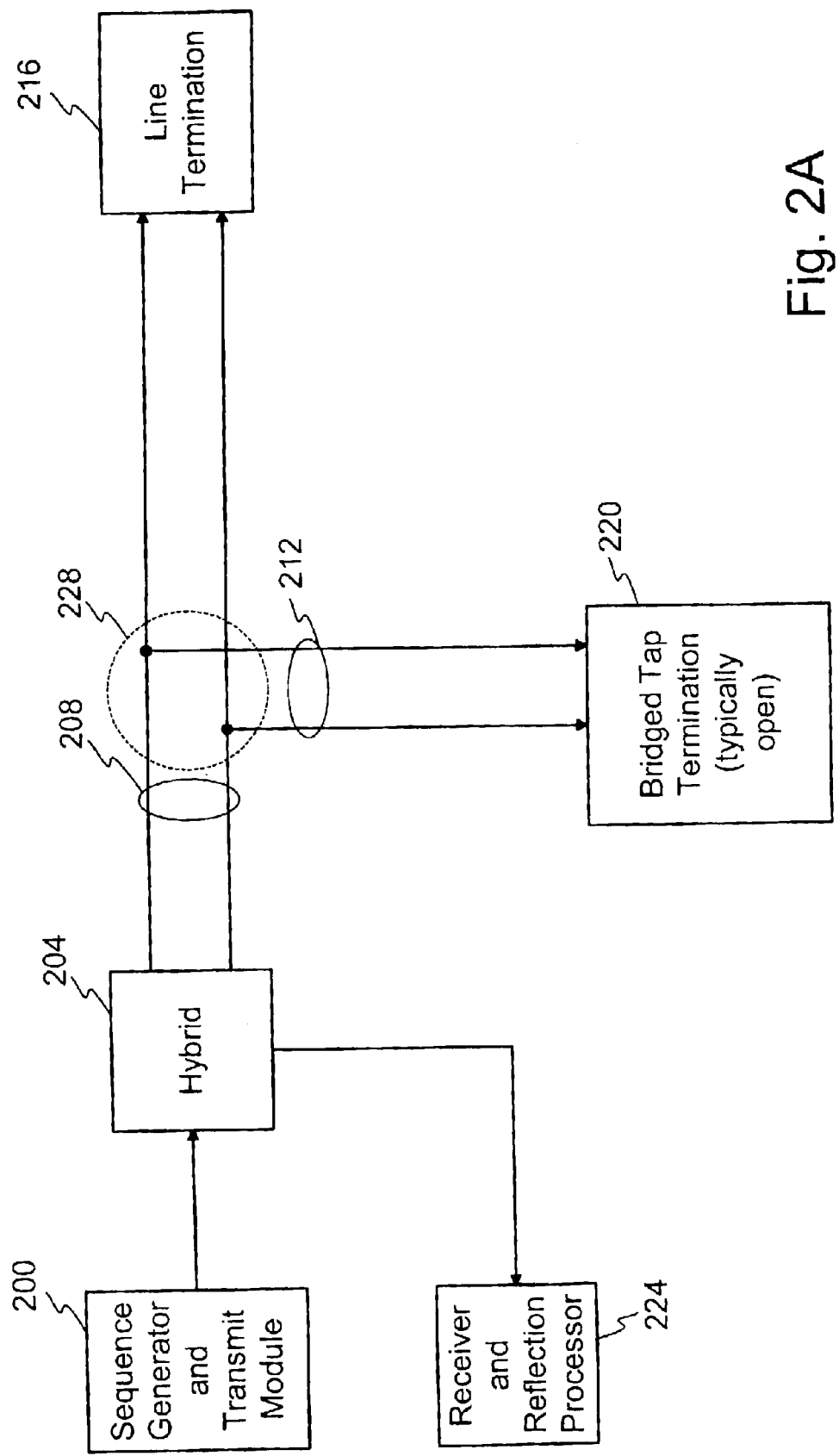
FIG. 2A illustrates a block diagram of example embodiment in relation to a communication line and an example line anomaly.

FIG. 2A illustrates a block diagram of example configuration in relation to a communication line and an example line anomaly. A sequence generator and transmit module 200 connect to a hybrid 204. The hybrid 204 connects to channel 208. In one embodiment, the channel 208 comprises a twisted pair conductor. In another embodiment, the conductor comprises fiber optic cable. In yet another embodiment, the channel may comprise coaxial cable or radio waveguide.

The opposite end of the channel 208 connects to a line termination 216. It is contemplated that the line termination 216 may comprise an open circuit, short circuit, or a termination impedance matched to the line. Both an open circuit and a short circuit create reflections. Although not the case in every channel, for purposes of understanding a line anomaly 220 resides between the hybrid 204 and the line termination 216. In the embodiment shown in FIG. 2, a conductor 212 is spliced into the channel 208 forming a bridged tap. The bridged tap is typically terminated in an open circuit. In one embodiment, the conductor 212 comprises the same type channel material as the channel 208. In another embodiment, the conductor 212 comprises the same general class of transmission line with slightly different properties, such as wire gauge. Other line anomalies may include an open circuit or a short circuit in the channel cable 208. It is contemplated that the line anomaly may be located at any distance from the point at which the test is applied and, in the case of a bridged tap, the spliced cable may be of any length. Hence, the conductors 208 and 212 may assume any length.

The hybrid 204 also connects to a receiver and reflection module 224 that is configured to monitor for and receive reflection signals from the hybrid arriving over the channel 208.

The sequence generator and transmit module 200 comprises a configuration of software, hardware, integrated circuit, analog system, or some combination thereof that is collectively configured to generate a sequence signal in accord with the teaching discussed below. It is contemplated that the sequence generator portion of the module 200 generates a sequence signal for transmission over the channel 208. As discussed below in greater detail, the sequence signal has numerous advantages over the prior art use of a single high power pulse when used for time domain reflectometry. Any type of sequence signal may be utilized and is compatible with and covered by the scope of the invention. In one embodiment, a sequence signal with good autocorrelation properties is used. In one embodiment it is desired to have a signal with a generally flat frequency response across the frequency spectrum that will be used for communication. Several different example sequence signals are provided below for purposes of understanding. However, the invention is not limited to the specific sequences specified in this document. Further, numerous different types of transmitters, modulator, filters and other transmit components may be adopted for use and are contemplated as being covered by the claims. The invention is not limited to any particular type of transmit system.

In one embodiment, the sequence generator portion of the module 200 is embodied in software and configured to execute in conjunction with a processor to generate a physical electrical signal. Any type of processor, hardware, or integrated circuit may execute the software code. The software may be stored in memory or any computer readable medium.

The hybrid 204 operates as understood in the art. It is designed to allow the signal received from the channel 208 to pass through to the receiver but to minimize the amount of the transmit signal which is directly coupled into the receiver. There is, in general, some residual signal directly coupled to the receiver and this is termed the near-end echo.

The line anomaly comprises any connection, break, disruption or aspect that creates an impedance mismatch. When encountered by a signal, such as a sequence signal, this mismatch creates a reflection that echoes back in the direction of the received signal. In one embodiment, the line anomaly 220 comprises a load coil. In another embodiment, the line anomaly 220 comprises a bridge tap. Other line anomalies include but are not limited to, semi open or short circuits, moisture or corrosion on the linear a change in wire gauge.

The receiver and reflection processor 224 comprises a configuration of software, hardware, integrated circuit, analog system, or some combination thereof that is collectively configured to receive a reflection sequence signal and process the reflection sequence signal to obtain information regarding anomalies on the channel 208. As discussed below in greater detail, the sequence signal has numerous advantages over the prior art signal of a high power pulse when used for time domain reflectometry. Any type of reflected sequence signals may be processed and is contemplated as being compatible with and covered by the scope of the invention. Further, numerous different types of receivers, demodulator, filters, or other transmit components may be adopted for use. The invention is not limited to any particular type of receiving system.

In one embodiment, the receiver and reflection processor 224 is embodied in software and configured to execute on a processor. Any type of processor, hardware or integrated circuit may be used to execute the software code. The software may be stored in memory or any computer readable medium.

Figure 2B:
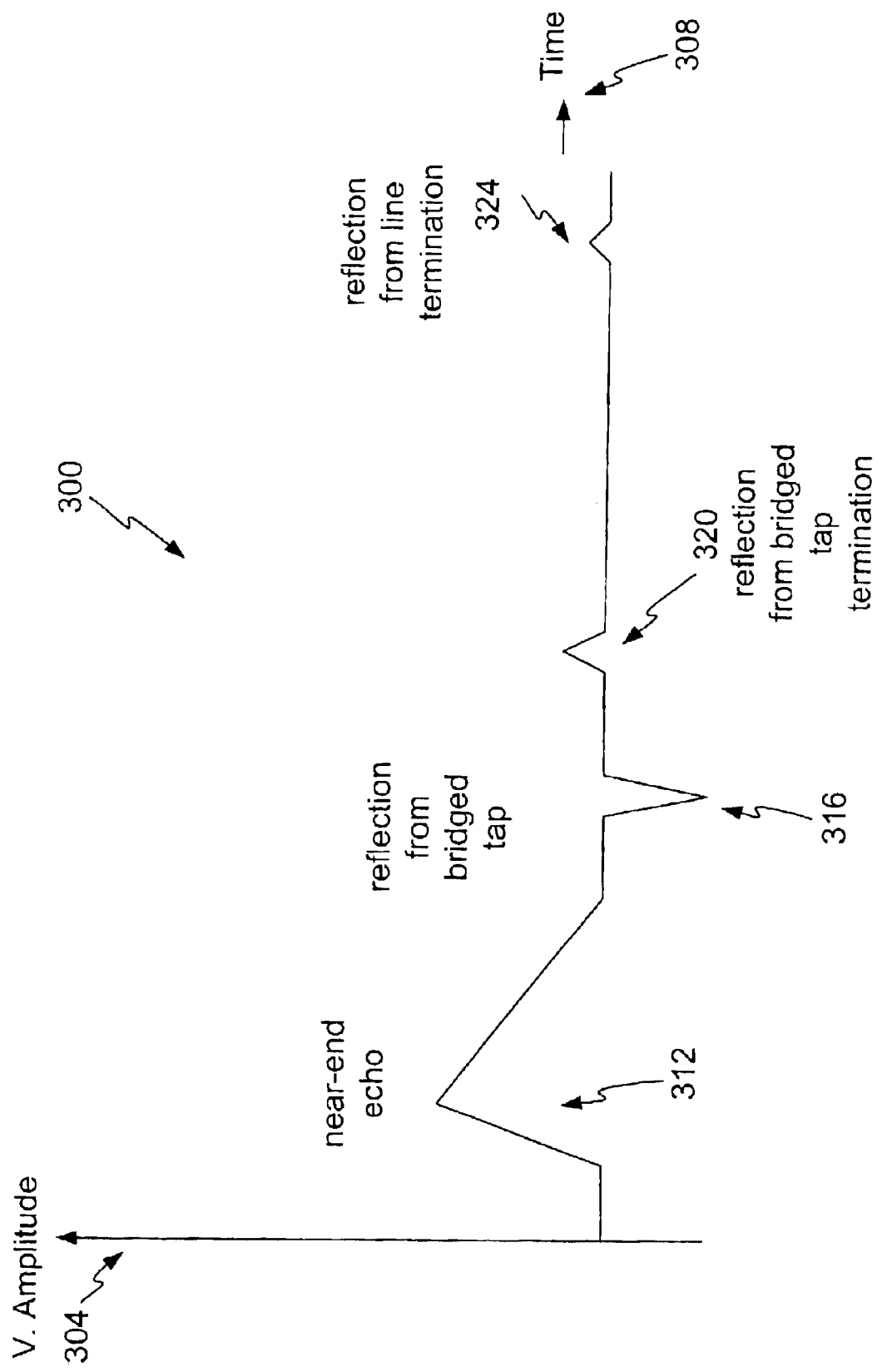
FIG. 2B illustrates a plot of an example reflection signal as may be generated by and correspond to the exemplary embodiment of FIG. 2.

FIG. 2B illustrates an example plot of a reflection signal as may be generated by and correspond to the exemplary configuration of FIG. 2A. FIG. 2B is described with reference to FIG. 2A. The reflection signal plot 300 is in relation to a vertical axis 304 representing voltage and a horizontal axis 308 representing time. The plot 300 is generated by processing in accord with the invention in response to sending a sequence signal on the channel, receiving the reflection signal, and then processing the reflection signal. The processed reflection signal 300 reveals peaks or points of reflections at a time 312, 316, 320, and 324. The peak at time 312 corresponds to the impedance mismatch created by the hybrid 204. In some embodiments, the peak at time 312, caused by the hybrid, is of significantly greater magnitude than the other peaks.

The peak at time 316 corresponds to the impedance mismatch created by the anomaly 228 (FIG. 2A) caused by the connection of conductor 212 to channel 208. The peak at time 320 corresponds to the impedance mismatch created by the line anomaly 220. The peak at time 324 corresponds to the impedance mismatch created by the line termination 216. Based on the time between pulses and the rate of propagation of a signal through the medium of the channel, the location of the anomalies or other impedance mismatches may be determined. By way of example, the propagation speed for category 3 twisted pair cable is about two-thirds the speed of light.

If the anomaly causes an impedance mismatch resulting in a decreased impedance, the reflection will have opposite polarity relative to the incident signal. If the anomaly causes an increase in impedance, the reflection will have the same polarity as the incident signal. Thus, an open circuit will produce a positive return while a short circuit will produce a negative return. In this manner the invention also provides information regarding the type of line anomaly. Other discontinuities may also be mapped.

Sequence Signals

In one configuration, the invention comprises use of periodic sequences for channel analysis. In one configuration, the invention comprises use of any sequence with good autocorrelation properties. The autocorrelation function of a sequence represented in continuous time, C(t), is given by:

$$R(t) = \int_{-\infty}^{+\infty} C(\tau)C(\tau+t)d\tau$$

One autocorrelation property is the Dirac delta function where R(t) equals infinity when t equals zero and R(t) equals zero for all other values of t. For practical finite sequences this can not be achieved. Therefore, with R(t) scaled such that the maximum value of R(t) equals one, we define good autocorrelation properties as $1-a \leq R(t) \leq 1$ for $-p \leq t \leq +p$ $e \leq R(t) \leq +e$ for $t \leq -(p+d), t \geq (p+d)$ where a and e are small percentages of one, p is a percentage of the sequence symbol period and d is a small percentage of p. Bounded by these requirements the values of a, e, p and d may be selected to provide the desired sequence signal.

In one embodiment, the value 'e' is directly related to the period of the M-sequence. If 'e' is too large, the correlation process will result in a side lobe. Hence, a small 'e' is desired but not required. In one embodiment, 'e' is between 15% and 40% of one. In a more preferred embodiment, 'e' is between 5% and 15% of one. In a most preferred embodiment, 'e' is less than 5% of one. Similarly, in an embodiment, 'd' is between about 15% and 45% of one. In a more preferred embodiment, 'd' is between about 5% and 15% of one. In a most preferred embodiment, 'd' is less than about 5% of one. It is preferred to reduce 'p', however, it is contemplated that various values of 'p' between zero and sequence symbol period. Thus, it may range from zero to one. The value 'a' influences width of the autocorrelation function. In some embodiments, a narrow impulse is desired. In one embodiment, 'a' is between about 15% and about 45% of one. In a more preferred embodiment, 'a' is between about 5% and about 15% of one. In a most preferred embodiment, 'a' is less than about 5% of one.

In one embodiment, a requirement on R(t) in the transition region defined by d is that the function be reasonably smooth and decreasing. Therefore, use of sequences with good autocorrelation properties closely approximating an impulse can quickly and accurately provide the desired reflection response information.

The autocorrelation function of a sequence represented in discrete time, C(n), is given by $$R(n) = \sum_{k=-\infty}^{\infty} C(k)C(k+n)$$

One autocorrelation property in this case is the Kronecker delta function where R(n) equals one when n equals zero and R(n) equals zero for all other integer values of n. Again, for practical finite sequences this function cannot be achieved. So, with R(n) scaled such that R(O) equals one, we define good autocorrelation properties as $R(n)=1$ for $n=0$ $-e \leq R(n) \leq +e$ for $n \neq 0$ where e is a small percentage of one. In one embodiment, the e is directly related to the period of the M-sequence. If e is too large, the correlation process will result in a side lobe. Hence, a small e is desired but not required. In an embodiment, 'e' is between 15% and 45% of one. In a more preferred embodiment, 'e' is between 5% and 15% of one. In a most preferred embodiment, 'e' is less than 5% of one.

One example of a sequence well suited to be a line probing signal comprises maximal length sequences (hereinafter M-sequences). M-sequences can be defined as a positive integer with no internal periodicity. An M-sequence can be defined by the following equation:

$$G(X) = g_m X^m + g_{m-1} X^{m-1} + g_{m-2} X^{m-2} + \ldots + g_2 X^2 g_1 X + g_0$$

whose coefficients are binary and where each arithmetic operation is performed modulo two. When constructed as an M-sequence, the length or period of the sequence is defined as $2^m - 1$.

Sequences are desirable signals for numerous reasons. One reason is that sequences can be generated by binary logic circuits, such as a scrambler or linear feedback shift register. Another desirable aspect of sequences is that they may be generated at very high speed because of the type of logic utilized to generate the sequence. Standard flip-flop and combinational type logic may be used to generate these types of sequences. Yet another desirable aspect of sequences, and M-sequences in particular, is that these sequences possess good autocorrelation properties that may be processed to closely approximate an impulse at a point of correlation.

Sequences as contemplated by the invention may be implemented or created in various ways. One method of M-sequence generation comprises use of linear feedback shift registers. One example linear feedback shift register configuration comprises a Fibonacci implementation consisting of a shift register where a binary weighted modulo 2 sum of the taps is fed back to the input. Another example implementation comprises a Galois implementation consisting of a shift register, the contents of which are modified at every step by a binary weighted value of the output stage.

This describes several particular types of sequence signals and is provided for purposes of providing an enabling disclosure for at least one class of sequences, however, the above description should not in any way limit the invention. Any type of sequence may be utilized to obtain the advantages over the prior as described herein.

Figure 3:
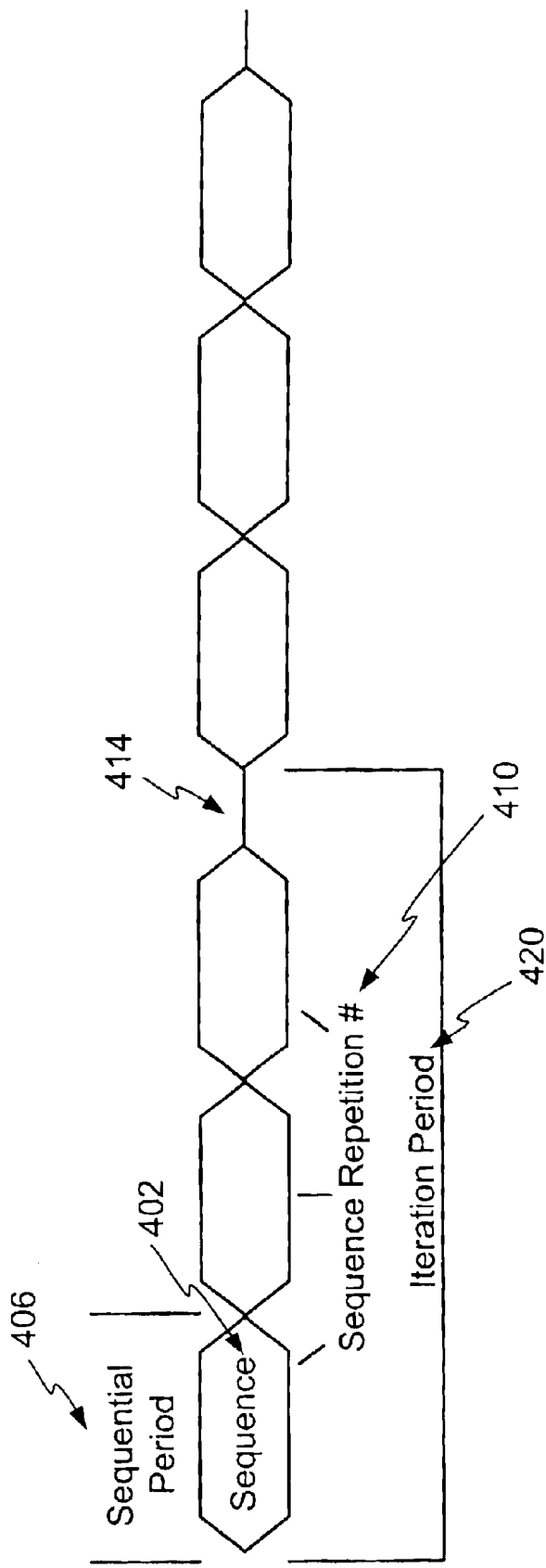
FIG. 3 illustrates a plot of an example sequence transmission pattern.

FIG. 3 illustrates a plot of an example sequence transmission pattern. It is contemplated that the sequence signal may be repeatedly generated and transmitted on the line in any various sequence. The sequence includes sequence period 406. Any number of sequence repetitions 410 may be combined. A silence period 414 may also be provided after a sequence repetition 410. The sequence repetition may comprise any number of sequences 402. A silence period 414 may optionally be provided between certain sequences. An iteration period 420 comprises a repeating group of sequences repetitions 410 and an optional silence period 414. In one embodiment, two or more sequence repetitions 410 or sequences 406 are transmitted in a row. Other combinations than the iteration period 420 shown in FIG. 3 are contemplated. FIG. 3 is provided for purposes of understanding and providing terminology to aid in understanding.

EXAMPLE EMBODIMENT

Figure 4:
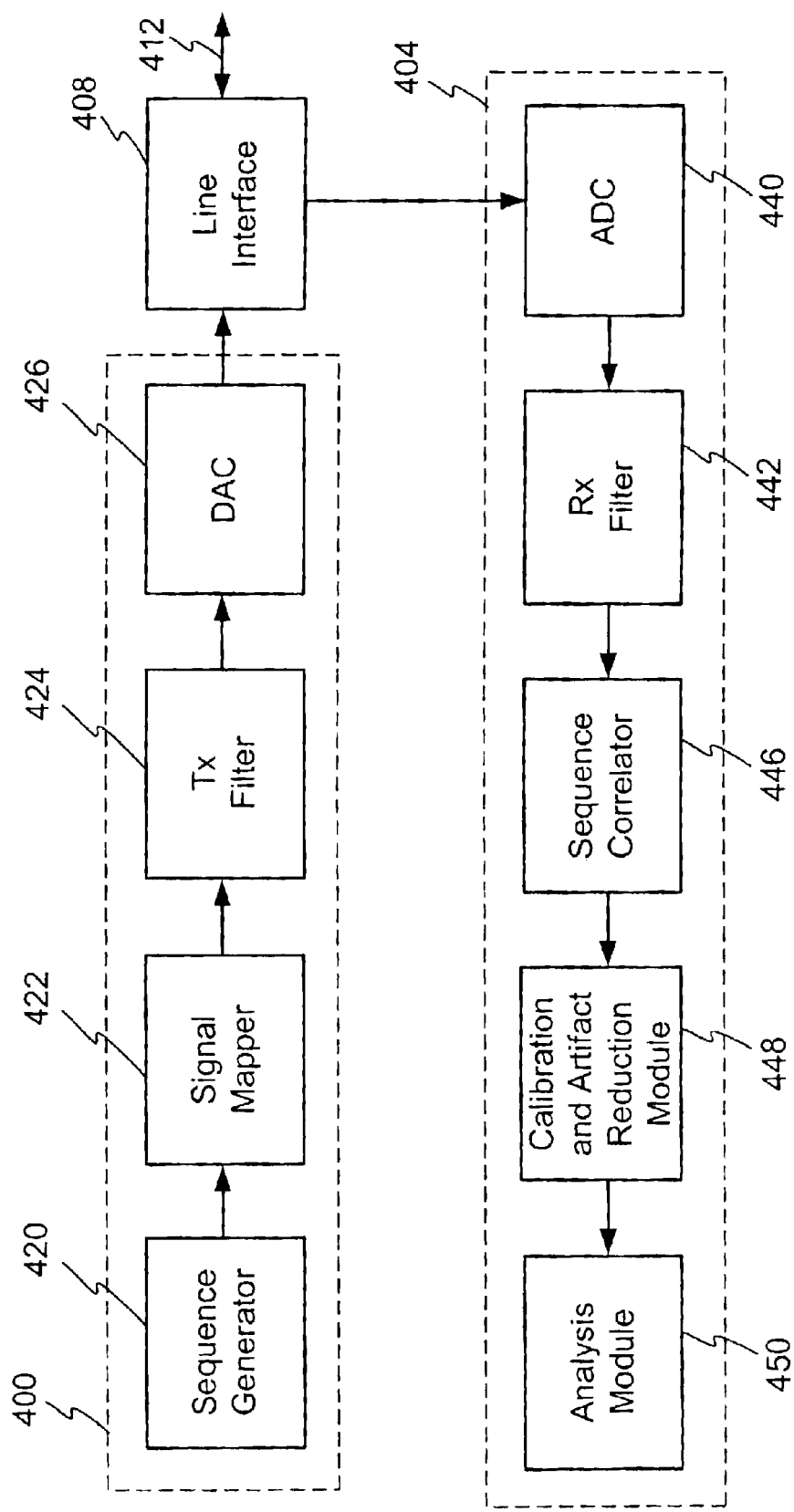
FIG. 4 illustrates a more detailed block diagram of an example embodiment of one configuration of the invention.

FIG. 4 illustrates a more detailed block diagram of an example embodiment of one configuration of the invention. Broadly, the elements of FIG. 4 includes a transmit module 400 and a receive module 404. Connecting the transmit module 400 and the receive module 404 is a line interface 408 and other possible logic and lines (not shown). The line interface 408 connects the transmit module 400 and the receive module 404 to a communication channel 412. The line interface 412 includes apparatus to separate or filter the transmitted signal from the received signal and attempts to impedance match the transmit module 400 to the channel 412 and the receive module 404 to the channel. In one embodiment, the line interface 408 comprises a hybrid. The line interface 408 may also be configured to interface a single conductor of the transmit module 400 or the receive module 404 to twisted pair conductors. Although designed to reduce impedance mismatch, the line interface 412 often creates some mismatch and hence may create a reflection during operation of the sequence time domain reflectometry as described herein. This reflection may be referred to near-end echo.

In the example embodiment of the transmit module 400 shown in FIG. 4, a sequence generator 420 connects to a PAM mapping module 422. The sequence generator 420 generates a sequence signal. The output of the PAM mapping module connects to one or more transmit filters 424. The transmit filters 424 provide the sequence signals to a digital to analog converter 426 and the output of the analog to digital converter connects to the line interface 408.

With regard to the receive module, the line interface is configured to receive and direct any reflection signals to an analog to digital converter 440. The output of the analog to digital converter 440 connects to one or more receive filters 442 and the output of the receive filters connects to a sequence correlator 446. The output of the sequence correlator 446 connects to a calibration and artifact reduction module 448, which in turn connect to an analysis module 450.

Transmit Module

The function of each element is now briefly described with more emphasis on the elements that are of greater importance to the operation of the invention and which may not be as well known. The sequence generator 420 comprises any apparatus or system configured to generate a sequence signal for transmission over the channel 412. In one embodiment the sequence generator 420 comprises at least partly software. In one embodiment the sequence generator creates a maximal length sequence (M-sequence). In another embodiment the sequence generator creates a Barker Code type sequence. In yet another embodiment, the sequence generator creates a Kasami type sequence. In the embodiment shown in FIG. 4 having a sequence correlator 446, it is desirable for the sequence to have good autocorrelation or cross correlation properties.

In one embodiment, the sequence generator 420 is embodied in a scrambler to generate a pseudorandom bit pattern or sequence in an attempt to output a data stream without long sequences of constant voltage values. Various different embodiments exist for generating a sequence signal.

Figure 5:
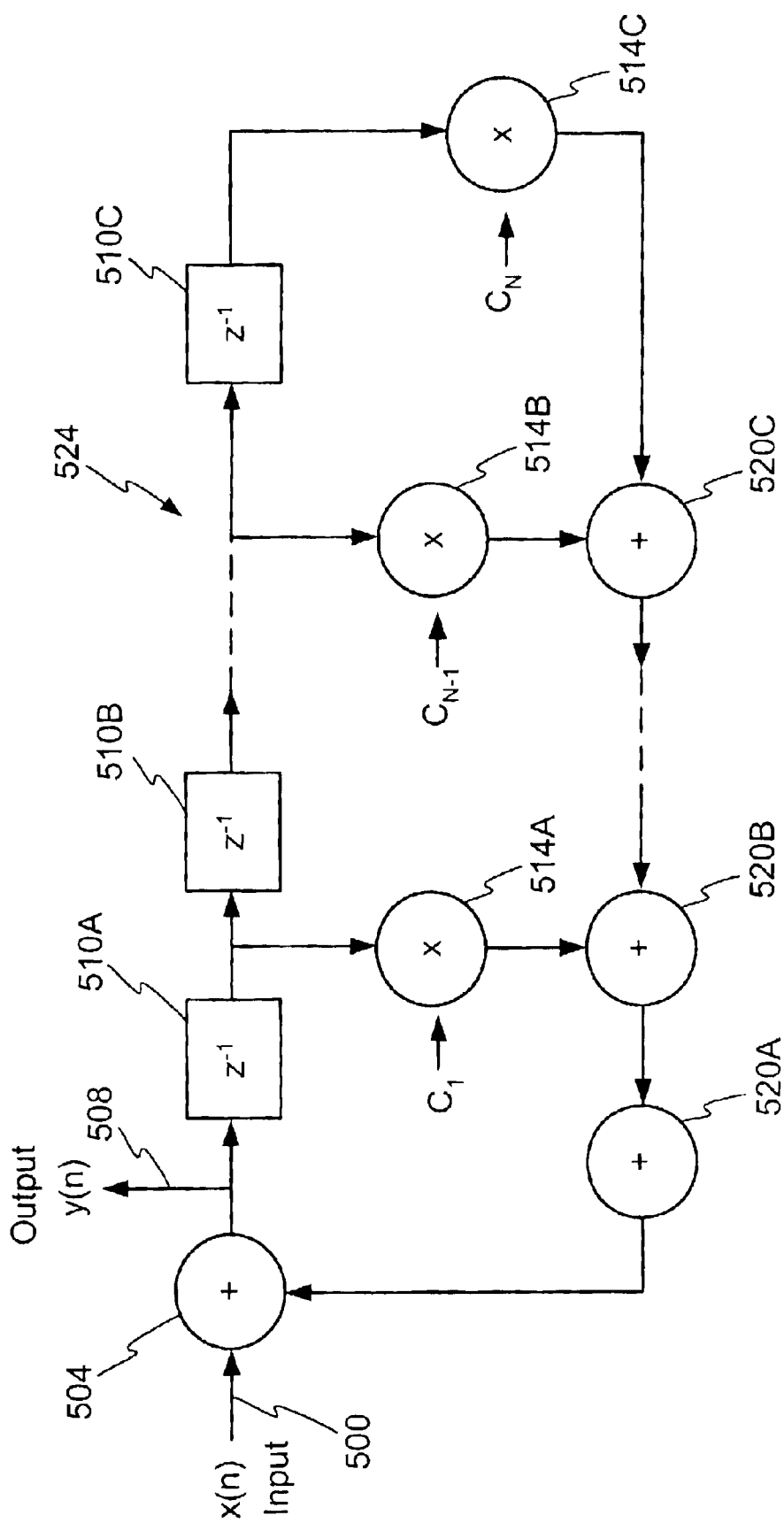
FIG. 5 illustrates a block diagram of an example embodiment of a sequence generator configured using a linear feedback shift register type implementation.

FIG. 5 illustrates a block diagram of an example embodiment of a sequence generator configured using a linear feedback shift register or scrambler type implementation. An input 500 connects to a summing unit 504. All arithmetic operations may be performed in a modulo-2 fashion. The summing unit 504 has an output connected to an output line 508 and a delay register 510A. The output of the delay register 510A connects to a multiplier 514A, having a multiplier set to $C_1$, and to another delay register 510B. The output of delay register 510B connects to N number of other delay registers and multipliers until connecting to a delay register 510C and to a multiplier $C_{N-1}$. The output of delay register 510C connects to a multiplier 514C that has a multiplier $C_N$. This creates an Nth order generator due to the N memory elements or delay registers 510. This thus generates an output based on the content of the registers, also known as the state of the scrambler. Thus, the total number of different possible states of the generator is $2^N$.

In one example method of operation, a continuous sequence of logic value 1's is provided to the input 500. The state of each register may be selectively loaded with a logical one or a logical zero based on the desired sequence to be generated. When provided with a string of logics one values, the generator outputs a unique string, or sequence, of 1's or 0's based on the values of the registers 510. In one embodiment, the values loaded into the registers are selected to form a primitive polynomial known to generate a maximal length sequence (M-sequence). The sequence will repeat through the $2^N-1$ non-zero states.

Figure 6:
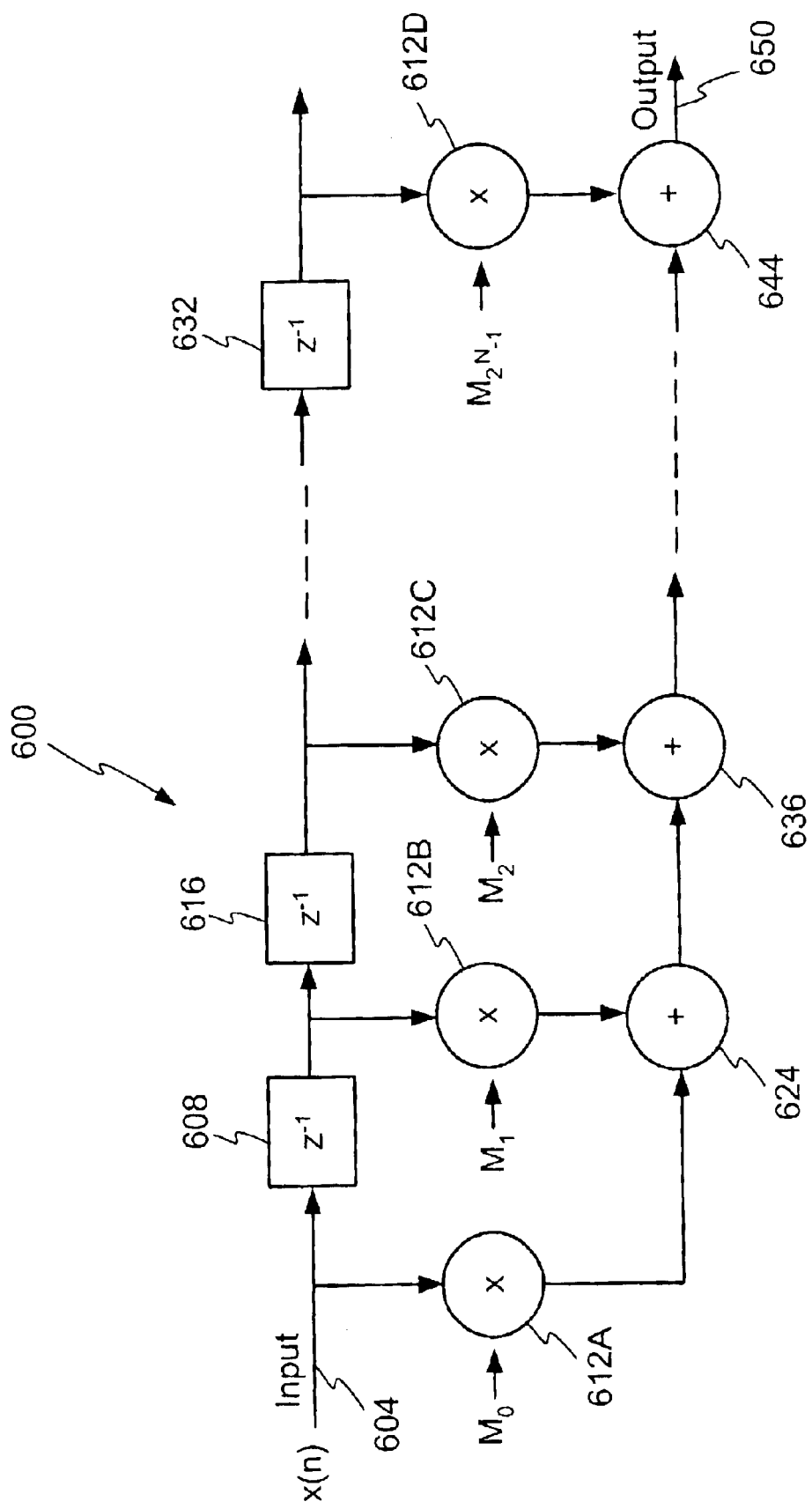
FIG. 6 illustrates an alternative embodiment of a sequence generator comprising a tapped delay line configuration.

FIG. 6 illustrates an alternative embodiment of a sequence generator. The embodiment shown in FIG. 6 comprises a tapped delay line configuration designed to generate a sequence for use with the systems described herein. As shown in FIG. 6, an input 604 connects to a delay register 608 that is configured to receive and delay for a clock cycle or other period the received value. The input 604 also connects to a multiplier 612A having a multiplier value $M_0$. All arithmetic operations in this embodiment may be performed in the traditional fashion, that is, not modulo-2. The output of the multiplier 612A connects to a summing junction 624.

The output of the register 608 connects to multiplier 612B having a multiplier value $M_1$. The output of the multiplier 612B connects to the summing junction 624 to add the output of the multiplier 612B and the multiplier 612A. The output of the register 608 also connects to a register 616, the output of which connects to multiplier 612C. The output of the multiplier 612C connects to summing junction 636, which also receives the output of summing junction 624. The tap delayed line 600 continues in this configuration until connecting to a register 632 that has an output connected to a multiplier 612D with a multiplier factor $M_2{}^N{}_{-1}$. The output of multiplier 612D connects to a summing junction 644 that also receives the output of the previous summing junction.

This configuration is $2^N-1$ long with the elements of the tapped delay line controlling the sequence generated. Specifically, the coefficients of the tapped delay line are the sample values of the desired sequence signal. An input of a pulse followed by zero-valued samples to the tapped delay line propagates through the tapped delay line and as the pulse propagates through the line, it encounters the multiplier values of the multipliers 612. The multiplier value will propagate to the output since all other coefficients are multiplied by zeros. In one embodiment, the multiplier values may comprise a logical 1 or a logical 0. The multipliers 612 each pass a logical 1 to its associated summing junction or pass a logical 0 to its associated summing junction. Hence, a sequence signal is output with values controlled by the values of the multipliers 612. In a variation of this embodiment, the values of the multipliers may be selected as other than 1's or 0's to thereby generate a mapping as is performed by the mapping module 422 shown in FIG. 4. In such a variation, the mapping module 422 can be eliminated.

Yet another embodiment of the sequence generator comprises a table look-up system. In a table look-up system, a sequence signal is stored in memory or a look-up table and recalled using a software interface. Hence, upon request of a particular sequence signal, the sequence generator 420 performs a table look-up, recalls the desired sequence signal from memory, and provides the sequence to the other systems of the transmit module 400. Any number or variation of sequences signals may be stored or retrieved.

Returning now to FIG. 4, the signal mapper 422 transforms the digital output of the sequence generator to any various signal levels that represent bit values. For example, four bits of digital data may be represented as 16 PAM, i.e. any of 16 different numerical values. The 16 different values may be represented on a scale of minus one to seven eighths in increments of ⅛. The signal may be scaled by an amplifier to yield a desired transmit power. In one embodiment the signal mapper 422 comprises a table look-up device or process that translates the binary input to a numeric output.

The transmit filter 424 is configured to manipulate the output data to adhere to desired or required spectral requirements. For example, frequency filtering may occur to improve system performance by tailoring the frequency content of the output or it may simply be mandated by FCC or a standards organization. It may be desired to attenuate out-of-band energy while also minimally effecting in-band energy. The embodiment shown in FIG. 4 implements spectral shaping with a digital filter. An analog filter may serve to reject images of the digital processing. Another embodiment eliminates any digital transmit filter. In such an embodiment, the spectral shaping is provided by the analog filter.

The digital to analog converter 426 is generally understood to convert a digital signal to an analog signal. In the embodiment shown, the transmission on the line occurs in an analog format.

Although not shown, an analog filter may also be included just prior to the line interface 408 in the transmit module 400 to perform final filtering of the analog waveform to spectrally prepare the signal for transmission over the channel 412. The analog filter may operate similarly to the transmit filter 424 but in the analog domain.

EXAMPLE SEQUENCES

In one configuration, the sequence generator 420 or other device with similar capabilities generates a sequence defined by varying the polynomial of the sequence generator to provide different sequence signals. In another configuration, the polynomial is selected to maximize the period of the sequence, such as to create an M-sequence. As described above, the period of a length-maximized sequence is defined as $2^m-1$ where m is the number of stages of shift registers used to generate the sequence.

By varying the number of stages m, the period is controlled. Various advantages may be gained by varying the period of the sequence. For example, one advantage of increasing the period of the sequence when used according to the invention for sequence time domain reflectometry is in mitigating the effects of correlated additive noise such as crosstalk. In the correlator, the noise component is decorrelated which spreads the noise across all frequencies thus reducing the amount of noise in the frequency band of interest. This improves the accuracy of the channel analysis. Another advantage of increasing the period of the sequence is that the system can provide a more complete response and longer channels may be analyzed. Yet another advantage of increasing the period of the sequence is that the reflection analysis is based on more tones with finer frequency spacing. Increasing the sequence period does not decrease the temporal resolution of the analysis. The temporal resolution is determined by the duration of one element of the sequence not the total length of the sequence.

An advantage of a shorter period generated by using a smaller m value is that the sequence may be generated and analyzed more rapidly. This speeds the process. Another advantage of shorter period sequences is a lowering of the computational complexity in the receiver.

Although numerous specific sequences are provided below, it is contemplated that any type sequence may be used. The text Introduction to Spread Spectrum Communications written by Peterson, Ziemer and Borth, (Prentice Hall, 1995), which is incorporated herein in its entirety, provides a discussion on different sequences and in particular different types of M-sequences. Table 3–5, from the above-referenced text, provides a list of primitive polynomials that may be used to generate the sequence. Any sequence period may be selected. Other sequence signals that are contemplated for use with the invention, than those listed, also exist.

In general, numerous M-sequences exist with periods depending on the number of stages in the shift register. There is at least one M-sequence for every integer greater than one where this integer represents the number of stages of the shift register. If more than one M-sequence exists for a given number of stages then the sequences are distinguished by the non-zero taps of the shift register. This is designated by the polynomial representation. In one embodiment of the invention, a sequence having a period of 31 is generated by a modem or other communication device, or test equipment, which may be located at any point of a communication channel. One polynomial defined by a period of 31 is:

$$s(n)=s(n-2) \oplus s(n-5) \oplus f(n)$$

where f(n) is the logical ones input to the sequence generator, s(n−k) is the tap point after the k-th delay element in the sequence generator and ⊕ is modulo-2 addition.

Another example polynomial that may be generated by a communication terminal and is defined by a period equal to 63 is:

$$s(n)=s(n-1) \oplus s(n-6) \oplus f(n)$$

Another example polynomial that may be generated by a communication terminal and is defined by a period equal to 127 is:

$$s(n)=s(n-3) \oplus s(n-7) \oplus f(n)$$

Another example polynomial that may be generated by a communication terminal and is defined by a period equal to 255 is:

$$s(n)=s(n-2)\oplus s(n-3)\oplus s(n-4)\oplus s(n-8)\oplus f(n)$$

In another embodiment of the invention, a sequence having a period of 31 may be generated by a communication terminal and adopted for use as a sequence signal. One polynomial defined by a period of 31 is:

$$s(n)=s(n-3)\oplus s(n-5)\oplus f(n)$$

where f(n) is the logical ones input to a sequence generator, s(n-k) is the tap point after the k-th delay element in the sequence generator and $\oplus$ is modulo-2 addition.

Another example polynomial that may be generated by a communication terminal and is defined by a period equal to 63 is:

$$s(n)=s(n-5)\oplus s(n-6)\oplus f(n)$$

Another example polynomial that may be generated by a communication terminal and is defined by a period equal to 127 is:

$$s(n)=s(n-4)\oplus s(n-7)\oplus f(n)$$

Another example polynomial that may be generated by a communication terminal and is defined by a period equal to 255 is:

$$s(n)=s(n-4)\oplus s(n-5)\oplus s(n-6)\oplus s(n-8)\oplus f(n)$$

The term communication terminal is defined to mean any configuration of software or hardware configured to facilitate or perform communication or generate a signal or sequence. In another embodiment the term communication terminal is defined to mean a piece of test equipment. This includes a modem, scrambler, sequence generator or other similar device, or a separate, stand-alone device.

Using the sequence signals, generated by the sequence generator, scrambler, or any other device capable of generating a corresponding sequence signal for time domain reflectometry provides advantages over the prior art signal of a single high power pulse. One such advantage comprises the ability to implement the sequence time domain reflectometry in an integrated circuit, such as within a communication device.

Receive Module

The receive module 404 includes the analog to digital converter to transform the received reflection signal from the analog domain to the digital domain. An amplifier (not shown) may be placed between the line interface 408 and the analog to digital converter 440 to amplify the possibly weak reflection signal from the channel 412. In one embodiment, the analog to digital converter 440 comprises a fourteen bit converter. Increasing the precision of the converter improves the dynamic range of the receive allowing smaller magnitude returns to be detected, such as those from a very long transmission line.

The receiver filters 442 comprise standard filters such as high and low pass filters to eliminate unwanted frequency components that are outside of the frequency band of the reflection signal. Any type of digital filtering may be performed by the filters 442. In addition, analog filters (not shown) may be located prior to the analog to digital converter 440 as necessary to filter the reflection signals received from the line interface 408 prior to conversion into the digital domain.

The sequence correlator 446, which receives the output of the receiver filters 442, comprises a configuration of hardware, software, or combination thereof, that is configured to correlate the reflection sequence signal with a copy or duplicate of an original sequence signal that was generated by the sequence generator 420. Although not shown, the sequence correlator 446 may communicate or connect to the sequence generator 420. In one embodiment, the correlation comprises cross correlation. Mathematically, in one embodiment, a crosscorrelator is realizing the following function:

$$h(n)=\sum_{k}C(k)X(k+n)$$

where X(n) is the sum of the transmitted sequence C(n) plus any additive noise and crosstalk. In one embodiment the correlator 446 is embodied using a sliding tapped delay line. There are numerous ways to implement the correlator 446 and this is but one example embodiment. The correlator 446 may be embodied in hardware, or software, or a combination of the two. Indeed, it is contemplated that an analog implementation of the correlator maybe preferred particularly in high rate applications. In this implementation analog to digital converter 440 maybe omitted. In the sliding tapped delay line method the taps are C(n).

One example embodiment of a cross correlation device is shown in FIG. 7. FIG. 7 illustrates block diagram of a correlation unit configured to correlate a received signal with a signal C(n). An input 704 connects to a multiplier 708. A second input 712 provides a second signal to the multiplier 708. The output of the correlator connects to a summing junction 718, which has an output 720.

The received reflection signal is provided on input 704 to the multiplier unit 708 while a sequence signal C(n), that is generally identical to the sequence signal transmitted on the channel, is provided on the second input 712. These sequence signals are multiplied together on a value by value basis over time. The output of the multiplier 708 is summed, over time, in the summing junction 718 and provided on the output 720. The correlation system provides an output signal with a peak at the point when the signals align, i.e. correlate. A noticeable peak at the point of correlation indicates a sequence with good correlation properties.

The accumulator or summing junction 718 comprises a device configured to generate a running summation of the received signals. In general, the output of the summing junction 718 is generally similar to a first order approximation of an integral over the period of time that the system operates. Thus, the summing junction 718, upon receipt of a number, stores the number. Then, upon receipt of another number, the summing junction 718 adds the first number to the second number and stores the result. The process continues in this manner. In one embodiment, the summing junction 718 comprises one or more registers to store the accumulating result. The output of the correlation process is an estimate of the impulse response of the channel. This is a time domain signal.

Another example embodiment of the cross correlation is based on frequency domain processing. The cross correlation can be implemented in the frequency domain by multiplying together the frequency domain representation of the received signal and the reference signal. The reference signal may be the discrete Fourier transform (DFT) of the transmit sequence, inverted in time. When periodic sequences are used, the frequency domain representation can be constructed by using a DFT of the same length as the period of the signal. If the receive signal consists of multiple periods, then t he noise characteristics of the correlated signal can be improved by appropriately summing up multiple periods, either before or after taking the DFT of the received signal. For non-periodic signals or signals with long periods, it may be appropriate to compute the cross correlation in the frequency domain using the overlap-add or overlap-save methods. If the cross correlation is computed in the frequency domain, it may be appropriate to convert it back to the time domain for further time domain processing.

Returning to FIG. 4, as a result of correlating the reflection signal with the sequence signal as originally transmitted on the channel 412, the output of the correlator 446 provides a signal that may generally resembles the plot shown in FIG. 2B, although unwanted components may be present. When an echo signal is aligned with the sequence signal in the correlator, a peak occurs at the output. In this manner, the output of the correlator provides an indication of when the received signal contains an echo or point of reflection. These points correspond to anomalies in the line.

Advantages Regarding Noise

Another advantage of the correlation processing that occurs from use of a sequence signal having good correlation properties is with regard to noise. The invention sends a plurality of bits in the form of a sequence signal and then monitors for the received reflection signal, which is also a plurality of reflected bits in the form the sequence signal. Each anomaly generates a sequence of reflections. As a result of the spreading of the signal over a plurality of bits in the sequence, the received noise, such as random noise from static, interference or crosstalk, is spread over the length of the reflection sequence.

Figure 8A:
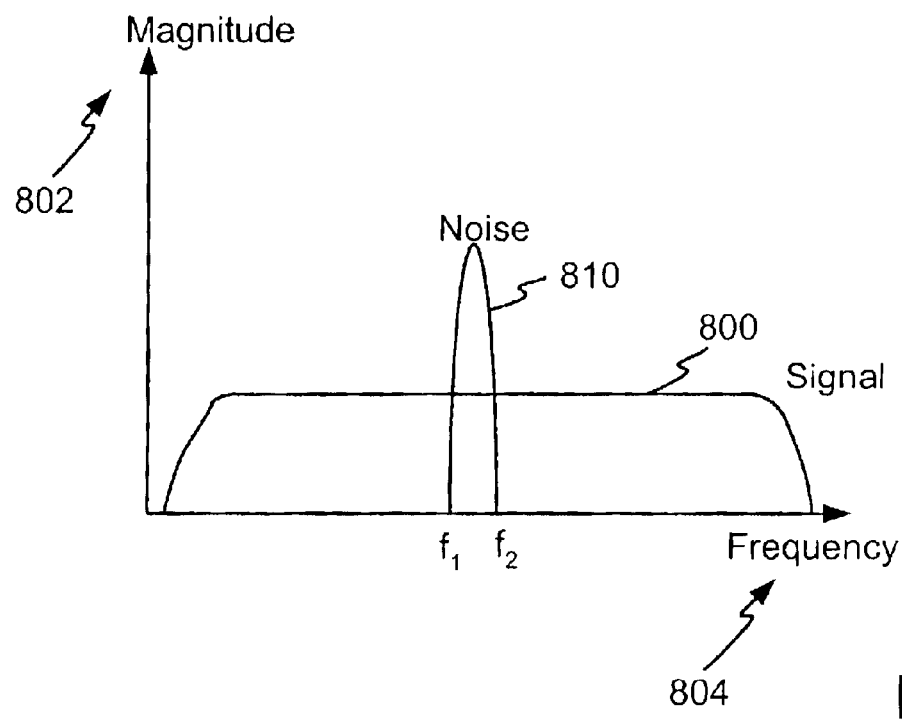
FIGS. 8A and 8B illustrate example plots of a sequence signal and associated noise before and after the correlation operation.
Figure 8B:
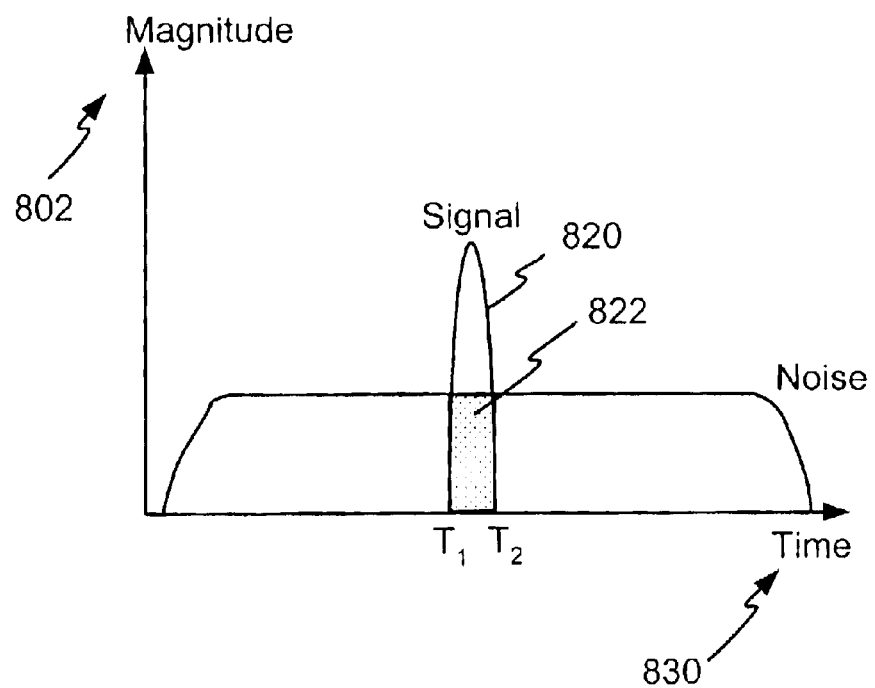

FIGS. 8A and 8B, which illustrates example plots of a sequence signal and the effect of correlation, are helpful in describing the advantages gained by the invention with regard to noise. FIG. 8A illustrates a plot of a sequence signal 800 in relation to a vertical axis 802 representing magnitude and a horizontal axis 804 representing frequency. An undesirable noise component 810 resides between frequencies $f_1$ and $f_2$. If a single pulse signal is transmitted, the noise that will be received with the reflection signal will disrupt analysis.

In reference to FIG. 8B showing a plot of the correlated signal 820 and the noise 822 that is part of the correlated signal after correlation in relation to magnitude on the vertical axis 802 and time on the horizontal axis 830. During the correlation process, the original sequence and the reflection sequence only correlate at the point of alignment, that is between times $T_1$ and $T_2$. Thus, noise on the reflection signal is disbursed over the time period of the correlation process. Correlation serves as a summation only at the point of correlation thereby reducing the effects of the noise. Hence, noise is a smaller portion 822 of the correlated signal because the noise is spread. Thus, the invention reduces the effect of noise on the line.

Another advantage of the invention is that it allows for the transmission of a lower power signal over the channel. Use of a low power signal eliminates interference, such as from crosstalk, with other adjacent lines, such as other pairs in the binder. Use of a low power signal provides the further advantage of enablement using an integrated circuit, such as built into a modem. This eliminates the requirement for the sequence time domain reflectometry system to be built into a separate piece of test equipment that is constructed to enable generation and transmission of a high power pulse.

It is contemplated that the power level of the sequence may be of any magnitude. In one embodiment the power level may be constrained by applicable standards such as the ITU G.shdsl or ANSI HDSL2 standards. This may be implemented by use of transmit filtering which conforms to the power spectral density constraints imposed by those standards. Since the sequence signal may be a valid data signal, it may conform to the standard specifications if the same transmit filtering is employed. This is not true in general for single pulse systems, which use an undesirable high power pulse.

In one embodiment the peak voltage of the sequence signal is less than 6 volts. In another embodiment, the peak voltage of the sequence signal is between 6 volts and 18 volts. In yet another embodiment, the peak voltage of the sequence signal is higher than 18 volts. This are but example ranges. Any peak voltage or power level may be selected.

Returning to FIG. 4, the calibration and artifact reduction module 448 may comprise software or hardware configured to manipulate or eliminate portions of the reflection signal. In one embodiment, the calibration and artifact reduction module reduces correlation artifacts. In one embodiment the calibration and artifact reduction module 448 comprises an interface to memory configured to recall one or more different signals or template signals. The signals or templates may comprise stored, calculated, recorded, or estimated behavior of one or more components or interfaces in the system in relation to a sequence signal. By subtracting the stored, calculated, recorded, or estimated behavior from the received reflection signal, unwanted or undesired portions of the reflection signal may be eliminated or reduced. This process is referred to herein as calibration. The template, to be subtracted from the received reflection sequences to thereby modify the reflection sequences, may be stored in memory, generated, or obtained by manipulation of stored data to obtain the desired signal. In one embodiment, the stored template is already correlated. In another embodiment, the stored template is not correlated until after being recalled from memory.

In one embodiment, the configuration of the line interface 408 may be such as to create a reflection such as near-end echo. Because the line interface 408 is close to the transmitter and receiver, the resulting near-end echo will have a large magnitude in relation to the reflection created from distant line anomalies. Such a disproportional signal may disrupt analysis of the reflections at issue and hence it may be desirable to reduce or eliminate this signal.

In one particular embodiment, the calibration and artifact reduction module 448 is configured to eliminate the reflection created by the line interface 408. In such an embodiment, one or more sample reflection signals, also referred to as templates, are stored in memory or means provided to generate or recall these template signals. After execution of the channel analysis and a reflection signal being received by the calibration and artifact reduction module 448, the module 448 recalls the template from memory or generates the template and subtracts the template from the received reflection signal. This removes or reduces the effects of the line interface to thus provide greater accuracy during subsequent processing. Prior to subtraction, the template is properly aligned with the reflection signal.

The analysis module 450 receives the signal from the calibration and artifact reduction module 448. In one embodiment, the analysis module 450 is embodied in software, stored on computer readable media and configured for execution by a processor or other software execution device. In one embodiment, the analysis comprises synchronization of the reflection signal to a time of transmission over the line. Based on the synchronization, the time between the start of the transmission and the receipt of each reflection peak can be calculated. Timers, a timing module, or counters in conjunction with peak detectors may be used to determine the time between sequence transmission and peak detection. The following equation may be used to calculate the distance to the line anomaly from the line interface. Assuming a rate of propagation of about ⅔ λ for twisted pair, where λ is the speed of light in units/second, then:

$$\text{distance(units)} = \left(\frac{2}{3}\lambda\right)\frac{\times \text{time\_until\_reflection\_peak}}{2}$$

This accurately provides the distance to the anomaly and thus allows service technicians to quickly locate and remedy or remove the anomaly. Various different mediums have different rates of propagation. In addition, the number and severity of the effect of the anomalies may be determined and a decision made regarding whether to repair or abandon the line. Of course, this is but one possible method of analysis.

FIG. 9 illustrates a plot of an example sequence signal 950. Signal amplitude 952 is represented on the vertical axis and time 954 is represented on the horizontal axis. The example sequence is provided for purposes of discussion only. Other sequences are contemplated.

Alternative Embodiment

Figure 10:
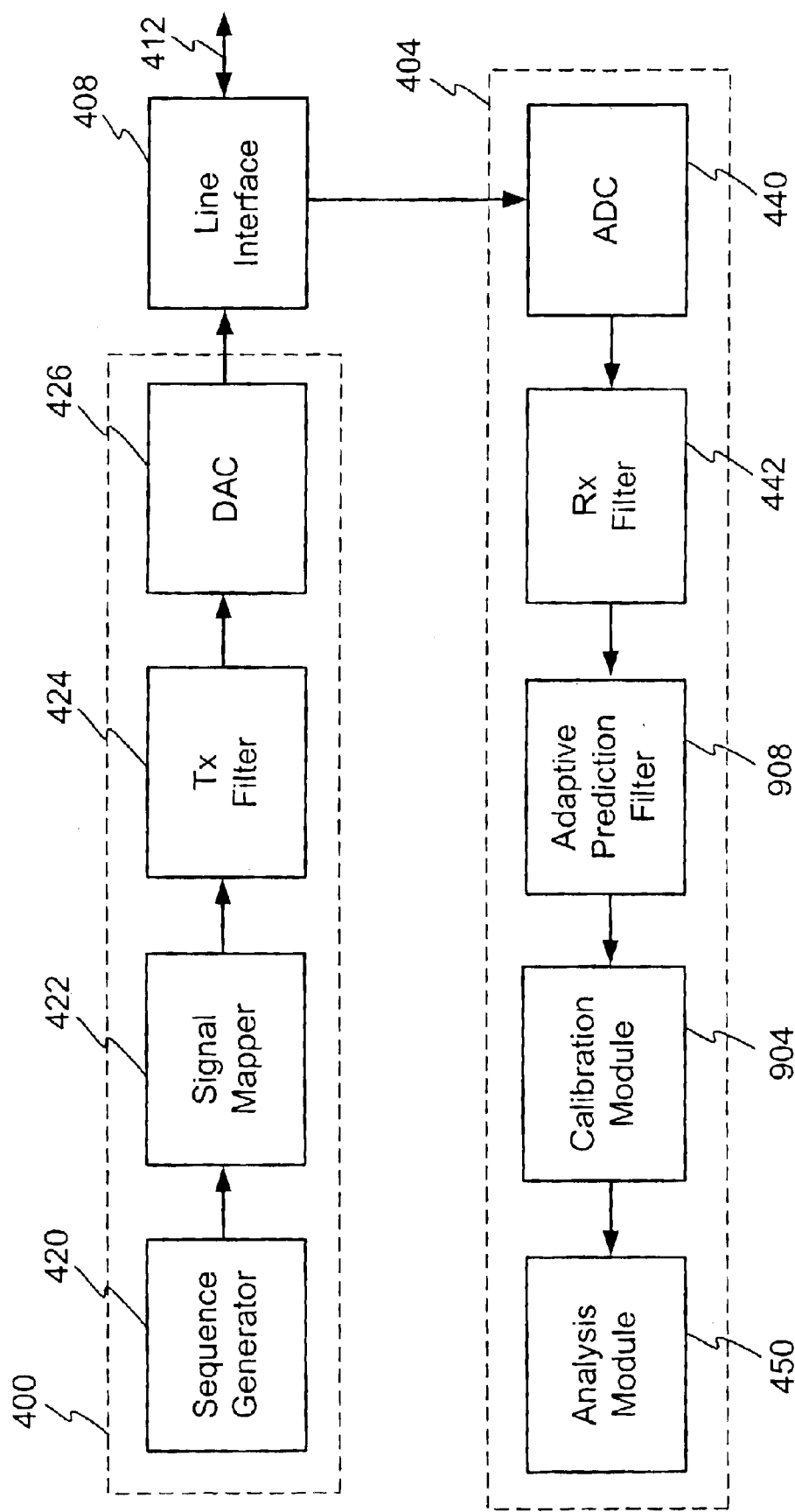
FIG. 10 illustrates an alternative embodiment of the invention.

FIG. 10 illustrates an alternative embodiment of the invention. As compared to FIG. 4, similar elements are identified with identical reference numerals. As shown, output from the receiver filters 442 connects to an adaptive prediction filter 908. The output of the filter 908 connects to a calibration module 904, which in turn has an output connected to the analysis module 450. The adaptive prediction filter 908 may comprises any type system configured to generate coefficients or other representative signals or values that portray the reflection response of the channel 412. The adaptive prediction filter 908 compares a reflection received from the channel to its own output and dynamically adjusts its internal coefficients or values to generate a signal that is generally identical to the reflection channel. This may occur via the use a feedback link. The internal coefficients or values of the adaptive prediction filter thus define the channel and can be analyzed to determine the location of anomalies in or on the line.

Figure 11:
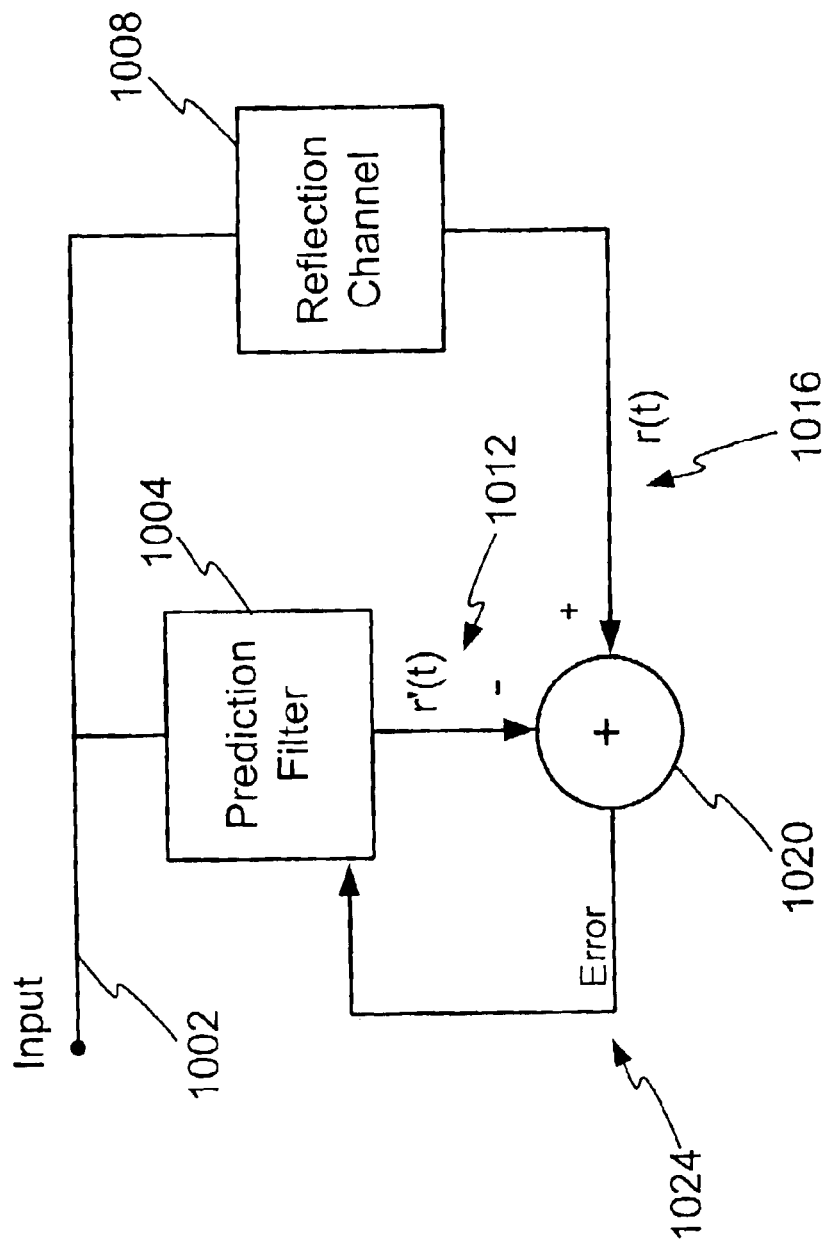
FIG. 11 illustrates a block diagram of an example configuration of a prediction filter configured to match the channel response.

FIG. 11 illustrates a block diagram of a representative configuration of a prediction filter configured to match the channel response. An input 1002 connects to the prediction filter 1004 and to the channel 1008. The reflection output of the channel 1008 is represented by the reflection signal r(t) 1016. The output of the prediction filter 1004 comprises an adapted signal r'(t) 1012 and feeds into a summing junction 1020 as a negative input. The reflection signal r(t) 1016 also connects to the summing junction 1020. Thus, the predictive filter output r'(t) 1012 is subtracted from the reflection signal r(t) 1016. The resulting output of the summing junction 1020 comprises an error signal 1024 representing the difference between the prediction filter output 1012 and the actual reflection signal 1016. The error signal 1024 feeds back into the prediction filter 1004. If the error signal is not zero or about zero, the prediction filter 1004 adjusts its coefficients or internal values to force the error signal 1024 to zero. When the error signal 1024 is zero or about zero, then the coefficients or values of the prediction filter represent the reflection channel. The sequence defined by the filter coefficients is an estimate of the impulse response of the echo channel, which is comprised of the near-end echo path and the transmission paths to and from each anomaly, which causes a reflection. Thus, it is an estimate of the correlated sequence signal and the same processing analysis can be employed that was applied in the embodiment of FIG. 4.

One example embodiment of an adaptive predictive response filter comprises a tapped delay line configuration as shown in FIG. 6. The multiplier values M are the values of interest in the prediction filter 1012. This may be implemented as a finite impulse response filter. The Electronic Handbook, edited by Jerry C. Whitaker from CRC Press, Inc., 1996, which is incorporated in its entirety herein, contains a discussion of digital and adaptive filters at page 749–772. It is contemplated that a direct form structure or a module form structure may be used.

Although the tapped delay line type system is described, it is contemplated that any echo cancellation type system may be adopted for use. Any system configured to generate a signal that is generally the same as a reflection signal received over the channel in response to the sending of a sequence signal may provide the necessary information to perform time domain reflectometry analysis of the channel. Once the system is configured in this manner, a single impulse followed by zeros applied at the input of the prediction filter will produce the impulse response of the reflection channel at the output of the prediction filter. It may be desirable to simply the utilized coefficient values of the prediction filter instead of inputting a pulse followed by zeros.

Operation

Figure 12:
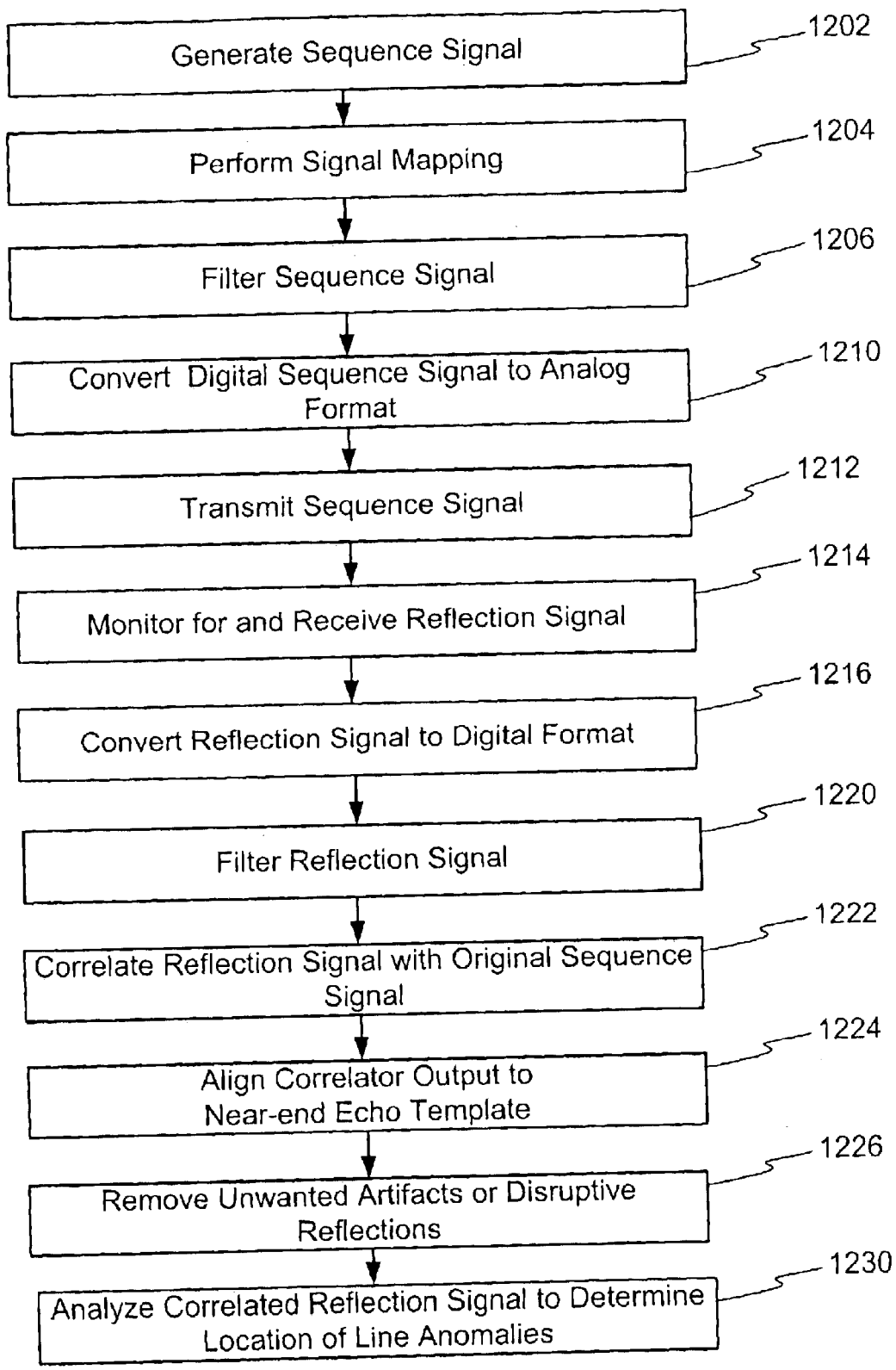
FIG. 12 illustrates an example method of operation of one embodiment of the invention.

FIG. 12 illustrates an example method of operation of one embodiment of the invention. This is but one example embodiment. It is contemplated that other methods of operation are possible and within the scope of the invention as define by the claims. At a step 1202, the sequence time domain reflectometry system (hereinafter system) generates a sequence signal. The sequence signal may comprise an M-sequence or any other type of sequence. In one embodiment, the sequence comprises a sequence with good autocorrelation properties. At a step 1204, the operation performs signal mapping to assign the sequence signal to one of several different values. At a step 1206, the system filters the signal to remove unwanted components. At a step 1210, the system converts the digital sequence signal to an analog format. At a step 1212, the system transmits the sequence signal over a communication channel. It is understood that transmission of a signal over a channel will generate reflections at points of impedance mismatch i.e., line anomalies.

At a step 1214 the system monitors for and receives any reflection signals generated by the transmission of step 1212. The reflection signal may be defined as the overall signal(s) received during a period of time after the transmission of the original sequence signal over the channel. Thus, the reflection signal may actually comprise several periods of silence and several individual echoes created by the sequence signal encountering impedance mismatches or other anomalies as it travels down the channel. During receipt, the reflection is converted to a digital format at a step 1216. The signal may be stored or processing may continue at step 1220 by filtering the reflection signal to remove signals at unwanted frequencies. At step 1222, the system correlates the reflection signal with the original sequence signal. The correlation reveals the location of peaks within the reflection signal. Considered in different terminology, the channel is monitored after the transmission of the sequence signal for a period of time sufficient for any reflections generated by the transmission to be recorded by the monitoring. The received signals during this period of time are converted to the digital domain and stored or processed. Correlation occurs at step 1220 between the original sequence signal and any signals recorded during the monitoring period of step 1214. Peaks in the correlated signal occur at the points of time in the received signal when a reflection was received.

At a step 1224, the system synchronizes in time the correlator output with the start of the sequence. This allows for an identification of a time, in relation to the start of the sequence signal transmission or other reference point, at which peaks or reflections occur. The peak of the near-end echo may serve as the reference time point. At a step 1226, the system removes unwanted artifacts or disruptive reflections. One example of a disruptive artifact is near-end echo created by hybrid. Thereafter, at a step 1230, the system analyzes the correlated reflection signal to determine the location of line anomalies. This may occur by processing the reflection signal to determine the time difference between the start of the sequence signal transmission and the peak in the correlator of the reflection signal. The time difference is multiplied by the rate of propagation of the signal through the channel. This provides the combined distance to and from the line anomaly using the transmitter or line interface as a reference point. The distance value may be divided by two to arrive at a distance to the anomaly.

Figure 13:
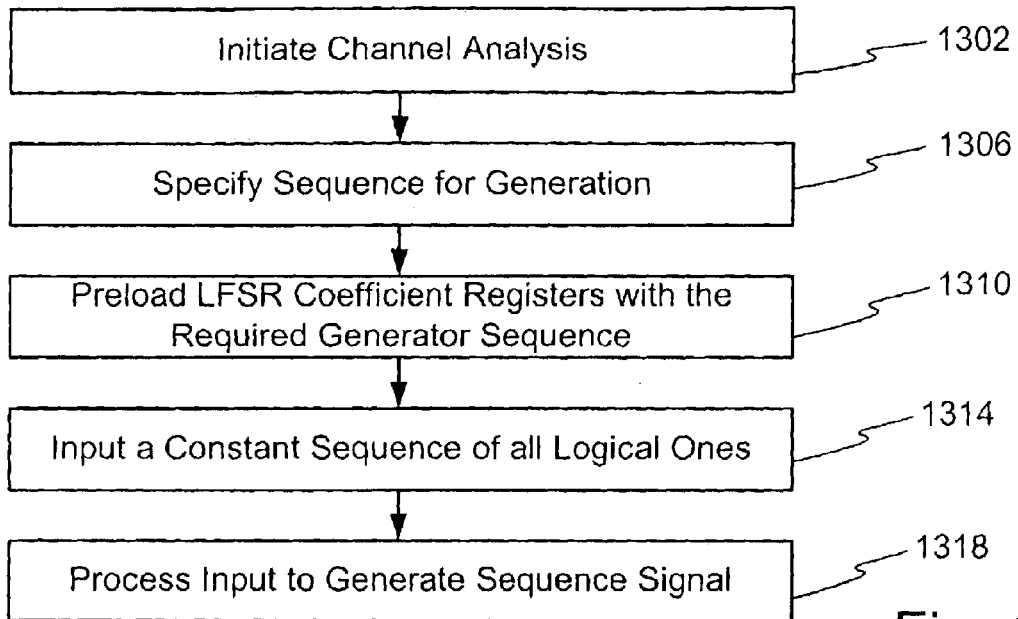
FIG. 13 illustrates an example method of sequence generation.

FIG. 13 illustrates a n example method of sequence generation. Numerous different methods of sequence generation are possible. The embodiment shown in FIG. 13 comprises generation by use of a linear feedback shift register (LFSR). At a step 1302, the sequence generation operation initiates the channel analysis process. Next, at step 1306, a specific sequence is designated for use. One characteristic of a specified sequence is its period. At step 1310, the operation preloads registers of the linear feedback shift register with values necessary to realize the specified sequence. At a step 1314, the operation begins inputting a constant sequence of logical 1's into the sequence generator. Thereafter, at a step 1318, the operation processes the series of logical 1's through the sequence generator to create the specified sequence signal.

Figure 14:
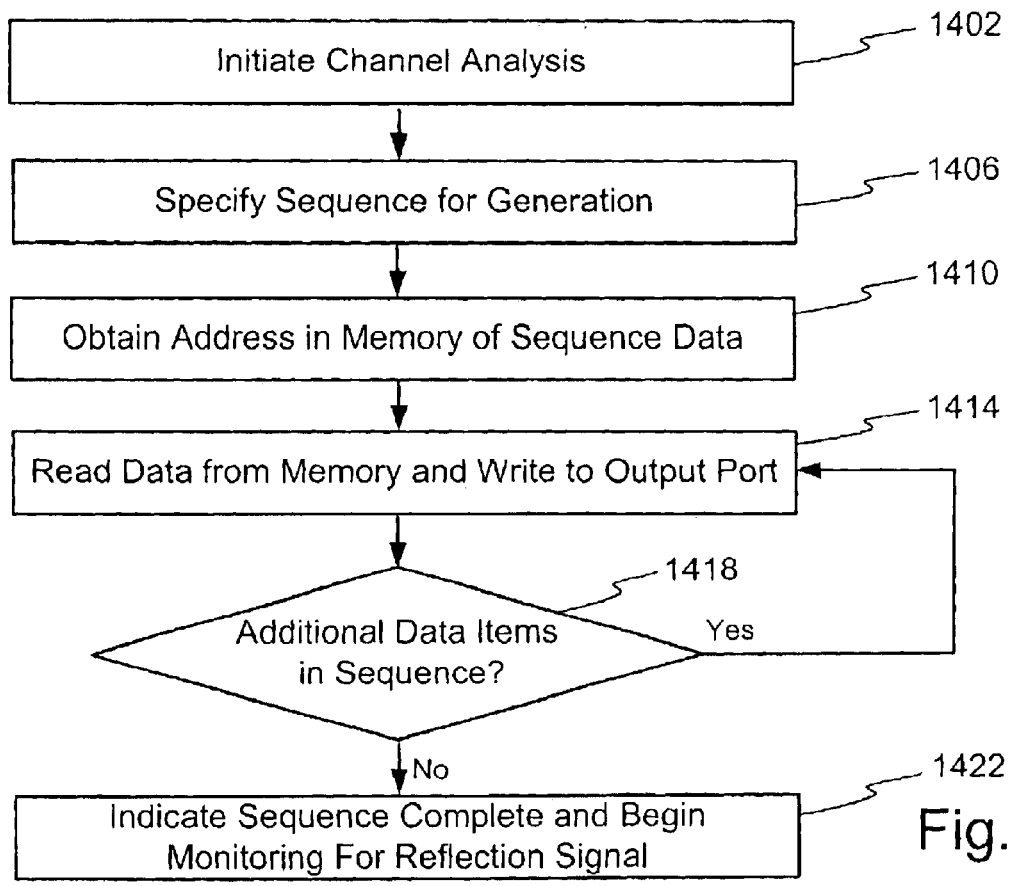
FIG. 14 illustrates an alternative method of sequence generation for use with a table look-up method.

FIG. 14 illustrates an alternative method of sequence generation such as might be implemented for use with a table look-up method. At a step 1402, the channel analysis process is initiated. Thereafter at a step 1406, the operation specifies a sequence for generation. Once the desired sequence is specified at a step 1410, the system obtains or is provided a memory address for the sequence data. Once the location in memory or the look-up table is provided or obtained, the system begins outputting the data items of the sequence. This occurs at step 1414. The operation then progresses to a step 1418 where the system queries to determine if there are additional data items remaining in the sequence. If additional data items exist, then the operation returns to step 1414 and an additional data item is output. If at step 1418 there are no more additional data items in the sequence to be output, then the operation progresses to a step 1422 to indicate that the sequence is complete and that the receiver aspects of the sequence time domain reflectometry should begin monitoring for reflection signals.

It should be noted that in the methods of FIGS. 13 and 14, the sequence may be generated and transmitted once, generated numerous times and sequentially transmitted numerous times, or generated at transmitted in some pattern with a period of silence between one or more sequence transmissions.

Figure 15:
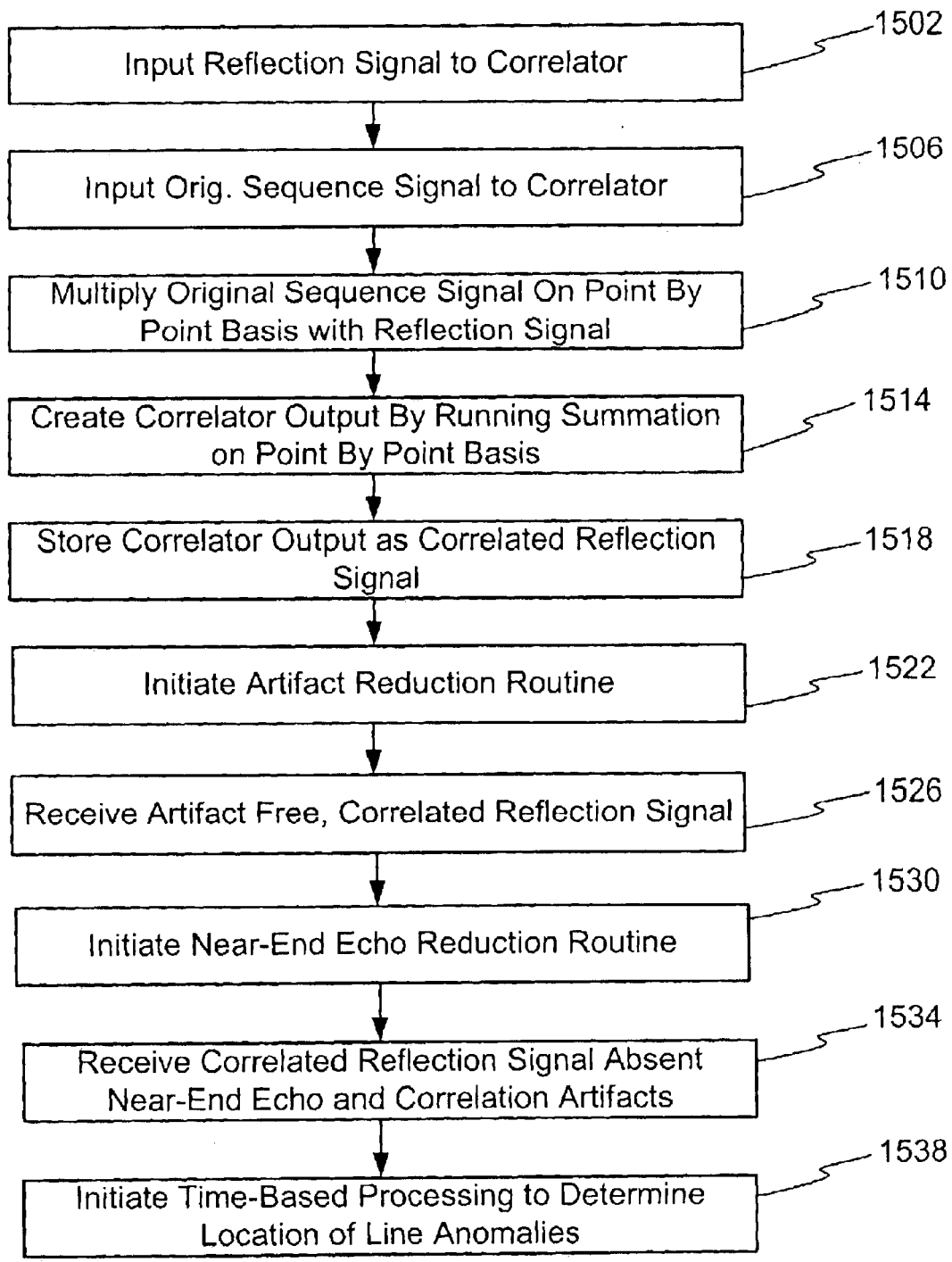
FIG. 15 illustrates an operational flow diagram of an example method of correlation and processing of reflection signals.

FIG. 15 illustrates an operational flow diagram of an example method of correlation and processing of a reflection signal. At a step 1502, the reflection signal is provided to the correlator. In addition, at a step 1506, the operation also provides the original sequence signal to the correlator. In one embodiment, this comprises loading the coefficients of the generator polynomial of the original sequence as coefficients in a scrambler to generate the same sequence as was originally transmitted over the channel. Next, at step 1510 the correlator multiplies the original sequence, on a point-by-point basis with the reflection signal. At step 1514, a correlator creates a running summation of the results of the multiplication of a step 1510. Next, at a step 1518, the operation stores the correlator output as the correlated reflection signal.

Next, at a step 1522, the system initiates an artifact reduction routine. The artifact reduction routing is discussed below in greater detail in conjunction with FIG. 16. After artifact reduction, the system, at a step 1526, receives an artifact free, correlated reflection signal.

Figure 17:
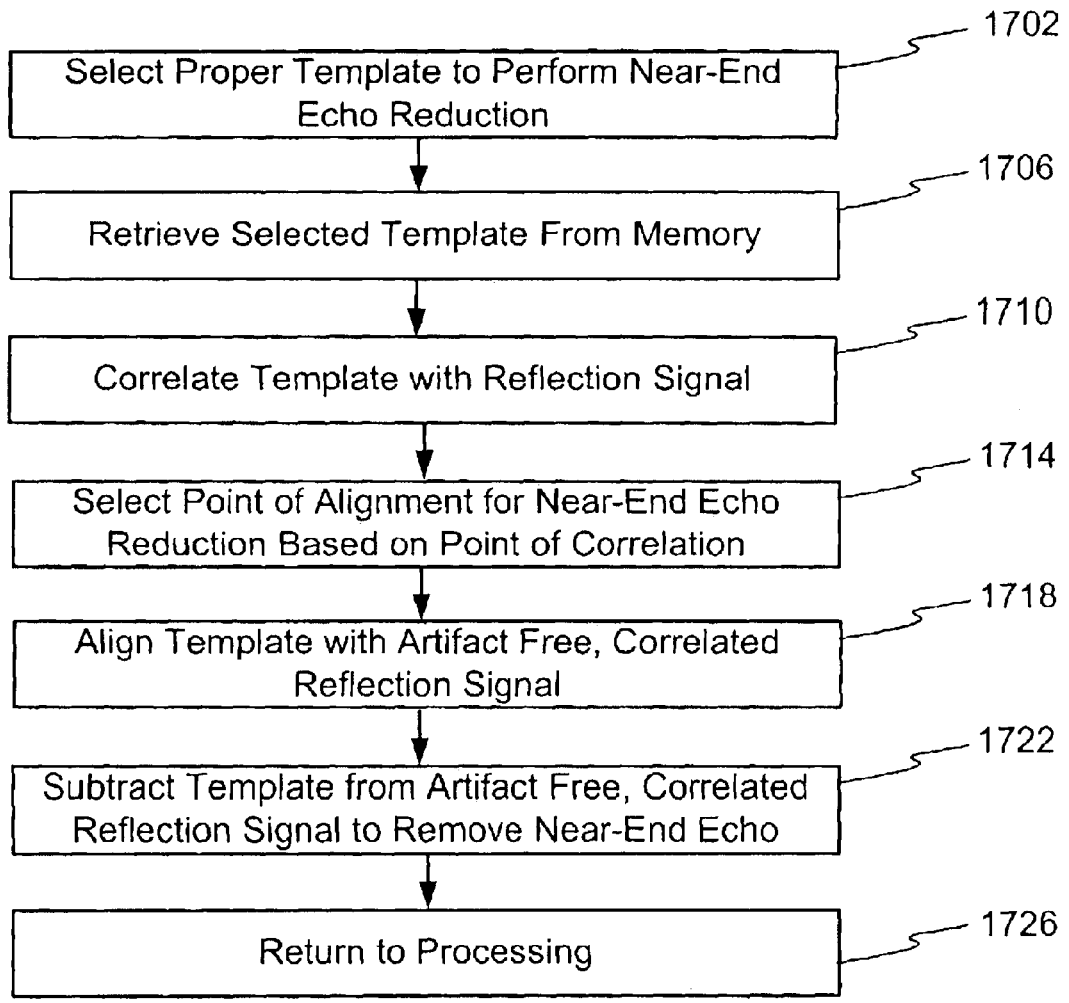
FIG. 17 illustrates an operation flow diagram of an example method of near-end echo reduction.

At a step 1530, the system initiates a near-end echo reduction routine. FIG. 17 provides an operational flow diagram of an example method of near-end echo reduction. After near-end echo reduction, the system receives a correlated reflection signal generally absent of near-end echo and generally without correlation artifacts. This occurs at a step 1534. At a step 1538, the operation initiates a time based processing to determine the location of line anomalies. This process is described in greater detail below in conjunction with FIG. 18.

Figure 16:
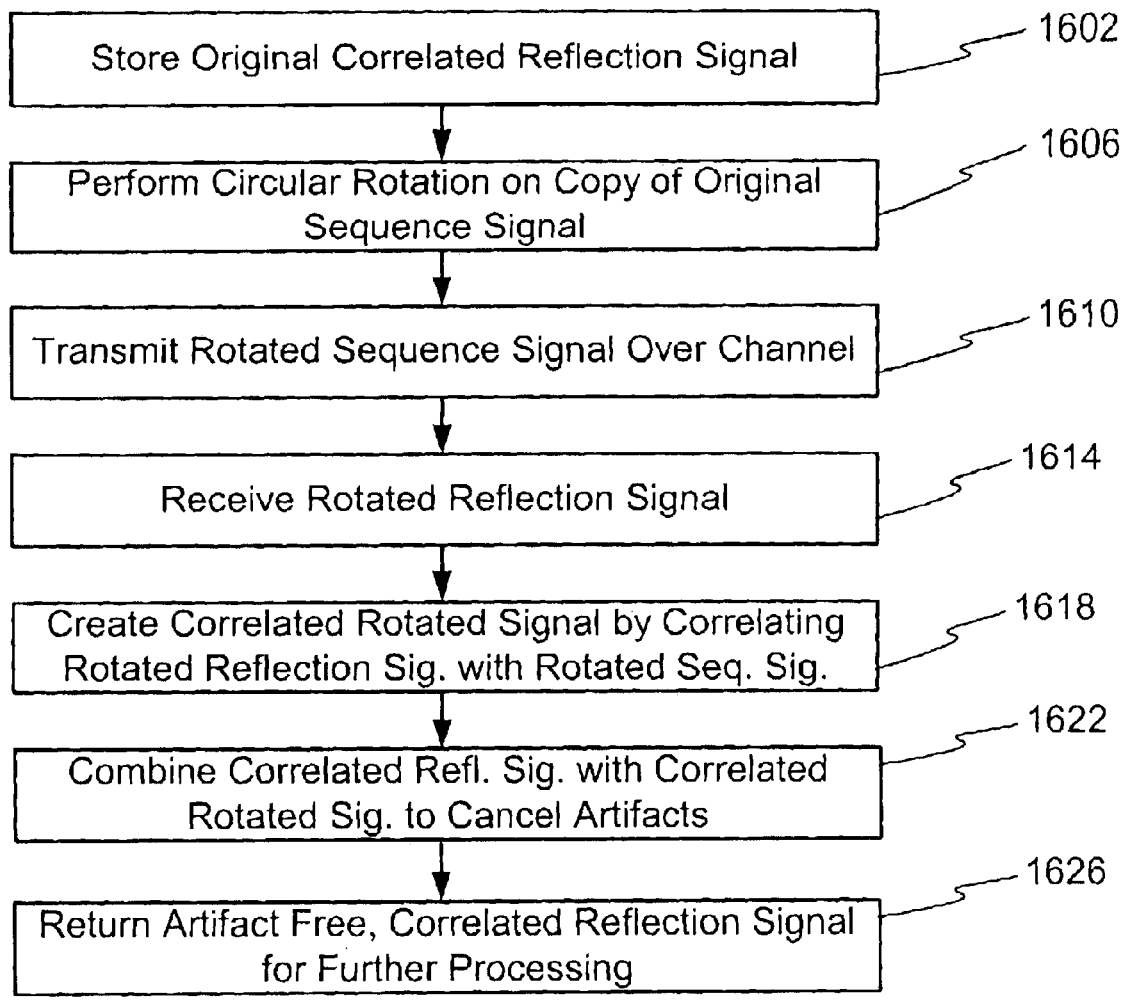
FIG. 16 illustrates an operational flow diagram of an exemplary method of artifact reduction.

FIG. 16 illustrates an operational flow diagram of an exemplary method of artifact reduction. The term artifact as used herein is defined to mean unwanted signal components that are generated by the correlation of the original sequence signal and the reflection signal(s). In one embodiment, a continuous stream of repeating sequences is not sent. In such an embodiment, one or more sequences are sent, followed by a period of silence. Correlation of a non-continuous stream of sequences may lead to partial correlations and thereby generate artifacts before and after the peaks generated at the point of correlation. These artifacts may be referred to as side lobes. The goal of artifact reduction is to remove or reduce the artifacts to thereby more clearly define points of correlation.

In one embodiment shown in FIG. 16, at a step 1602, the operation stores an original correlated reflection signal. This signal will be used in subsequent processing. Next, at a step 1606, the artifact reduction module performs circular rotation on a copy of the original sequence signal. Circular rotation comprises shifting of the values of the sequence by a shift constant k. The shift constant k determines the number of elements the sequences is rotated. By way of example, a shift constant of two shifts the original sequences defined by:

$$\{M_0, M_1, M_2, M_3, M_4, M_5 \ldots M_2{}^N{}_{-2}\}$$

becomes:

$$\{M_2{}^N{}_{-3}, M_2{}^N{}_{-2}, M_0, M_1, M_2, M_3, M_4, M_5 \ldots \}$$

after a circular shift with a shift constant k=2.

Next, at a step 1610, the system transmits the rotated sequence signal over the channel and the system monitors for a reflection signal. At step 1614, the system receives the rotated reflection signal that results from the transmission of the rotated sequence signal. After receiving and processing by the receiver, at a step 1618, the received rotated sequence signal is correlated with the rotated sequence signal. The rotated sequence signal is the signal that was transmitted to create the rotated reflection.

After this correlation, there exists a correlated rotated signal created from the transmission of the rotated sequence signal, receipt of a rotated reflection, and correlation of the rotated reflection with the rotated sequence signal. There also exists the original correlated reflection signal created by the transmission of the sequence signal, receipt of its reflection, and correlation of the reflection with the sequence signal. At step 1622 these two signals, the correlated reflection signal and the correlated rotated signal are combined causing the unwanted artifacts to generally cancel out. In some instances not all artifacts will cancel, but will be significantly reduced. This process may be repeated as needed using different shift constants to further reduce the artifacts. As a result, peaks representing the reflection created by a line anomaly are more clearly noticed and detectable. At a step 1626, the operation returns an artifact free, correlated reflection signal for further processing.

FIG. 17 illustrates an operational flow diagram of an example method of near-end echo reduction. One common source of near-end echo is the line interface, such as a hybrid. In many instances, the near-end echo created by the line interface is of a greater power level than other reflections caused by distance line anomalies. As a result, the high power near-end echo may mask or drown out the weaker reflections from more distance anomalies. Thus, it may be desirable to perform near-end echo reduction or removal.

At a step 1702, a near-end echo reduction module selects a template for the near-end reduction processes. At step 1706, the template is retrieved from memory. The term template as used herein is defined to mean stored data that corresponds or relates to the behavior of the line interface or other source of undesirably large echo. In one embodiment, one or more templates that correspond to the behavior of different hybrids are stored in memory for recall. In another embodiment, the near-end echo reduction module transmits an example sequence, and monitors the hybrid response and stores this response as the template. The template, as stored, may be correlated or uncorrelated.

At a step 1710, the system correlates the template signal that is recalled from memory with the reflection signal. Correlating these two signals creates a peak at the point where the two signals align. Thus, at step 1714, the operation selects the point in time when the two signals correlate. Using the point in time identified as the point when the two signals correlate, the operation moves to a step 1718 and aligns the template signal with the correlated reflection signal. At a step 1722, the template is subtracted from the correlated reflection signal to remove the near-end echo. Thereafter, at step 1726, the operation returns to processing as referenced in FIG. 15. This removes the near-end echo. It is contemplated that in other embodiments templates other than those corresponding to the reflection from the line interface may be stored and subtracted from the reflection signal. Thus, if other aspects of the reflection signal are to be removed or reduced, the method of FIG. 17 may be utilized.

Figure 18:
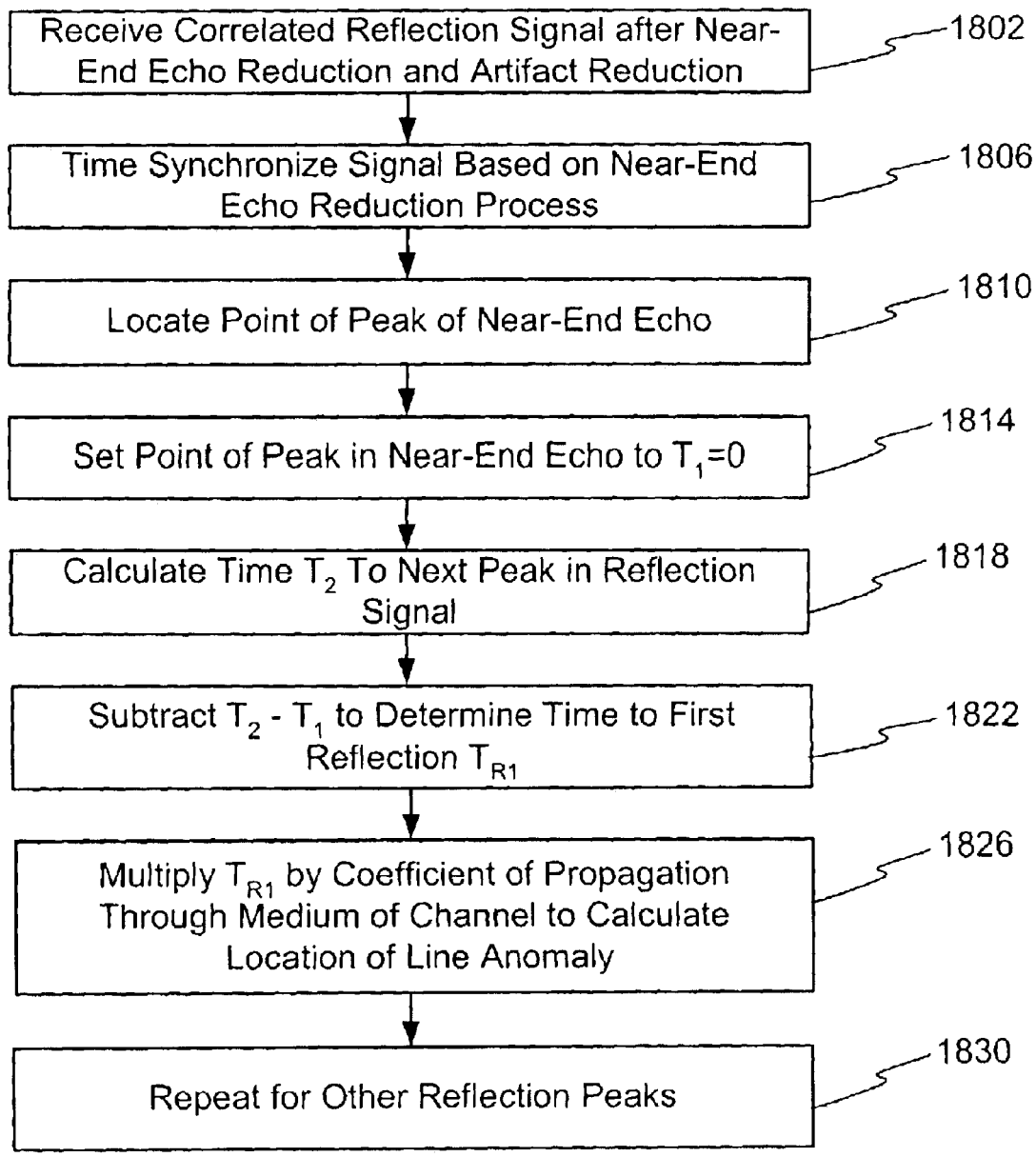
FIG. 18 illustrates an example method of processing the sequence signal to determine the location of line anomalies.

FIG. 18 illustrates an example method of processing the sequence signal to determine the location of line anomalies. In one embodiment, the sequence time domain reflectometry system is built into a modem. In one embodiment, the processing comprises a two-part process; alignment and time measurement. At a step 1802, the processing operation receives the correlated reflection signal. In one embodiment at this stage, the correlated reflection signal has undergone correlation, near-end echo reduction, and artifact reduction. After receipt, the operation may time synchronize the signal based on the information obtained during the near-end echo reduction processes. In one embodiment, the peak of near-end echo is the beginning of the reflection signal because the near-end echo occurs generally simultaneously with the start of the sequence transmission. Working from this basis, the time at which the peak of the near-end echo occurs is taken to be the start of the signal. This occurs at step 1810. In one embodiment, this information is provided from the near-end echo reduction module described in conjunction with FIG. 17.

At a step 1814, the peak in the near-end echo is assigned $T_1$ and referenced as time=0. Thereafter, at a step 1818, the operation calculates, in relation to $T_1$, the time at which the next peak in the reflection signal occurs. This is assigned time $T_2$. At step 1822, the processing subtracts $T_2$ from $T_1$ to determine the time it took between the sequence signal start and the first reflection. This time is assigned $T_{R1}$ for purposes of this discussion. Next, at step 1826, the process multiplies $T_{R1}$ by the velocity of propagation for the signal through the medium of the channel. This calculation yields a distance value, which reveals the location of the first line anomaly. At a step 1830, the operation repeats for the other peaks in the reflection signal.

Figure 19:
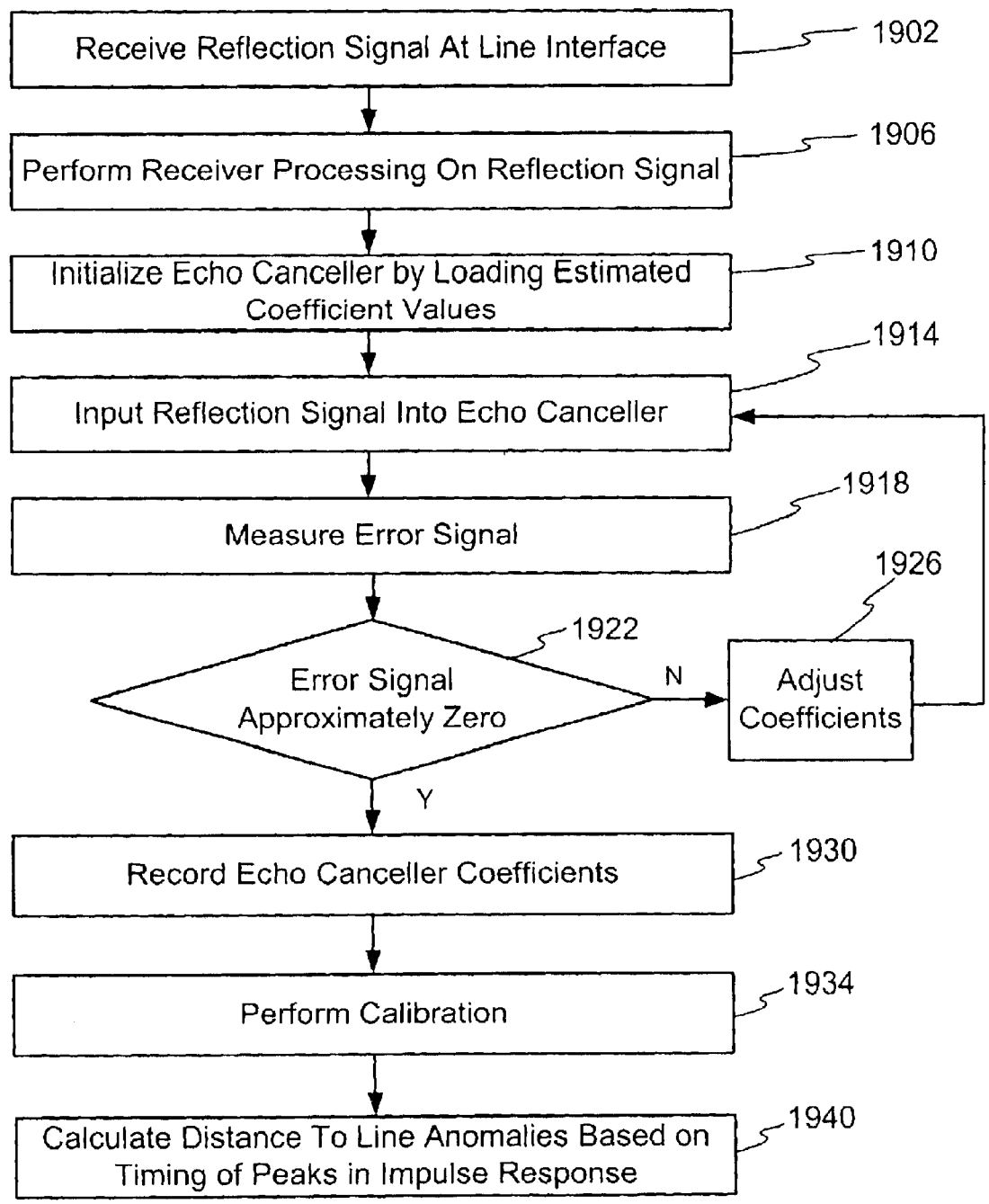
FIG. 19 illustrates an example method of operation for sequence time domain reflectometry using echo cancellation.

FIG. 19 illustrates an operational flow chart for an example method of operation for sequence time domain reflectometry using echo cancellation. This alternative embodiment is shown in FIG. 10. At a step 1902, this embodiment receives the reflection signal at the line interface and thereafter, at a step 1906, performs receiver processing on the reflection signal to prepare the signal for further processing. Next, at a step 1910, the operation initializes an echo canceller by loading estimated coefficient values into the echo canceller. This prepares the echo canceller to receive an input and generate an output. In one embodiment, the stored estimated coefficients comprise coefficients that are estimated to closely resemble the coefficients that will eventually be selected for the echo canceller. In one embodiment, the echo canceller comprises a finite impulse response filter. In one embodiment, the echo canceller includes a Volterra series expansion to model non-linear affects such as cable resistance, inductance and capacitance.

At a step 1914, the embodiment inputs the reflection signal into the echo canceller causing the echo canceller to generate an output based on the input and the loaded coefficients. The operation progresses to a step 1918 whereby the output of the echo canceller is subtracted from the reflection signal and any error or difference between the signals measured and fed back into the echo canceller. The error signal is the difference between the echo canceller output, which is determined by the coefficient values, and the reflection signal.

At a step 1922, the system determines if the error signal is approximately equal to zero. A generally zero error signal or equivalent is desired. If the error signal is not zero, then the operation, at a step 1926, adjusts the coefficients of the echo canceller to cause the error signal to approach zero. This processes continues until the error signal is generally zero. When, at step 1922, the error signal is generally zero, then the echo canceller coefficients are read at step 1930, from the echo canceller. These coefficients, when considered as a sequence, form an estimate of the impulse response of the reflection channel and can be used to determine the location of the line anomalies. The coefficients can be considered as the impulse response or a pulse followed by zeros may be fed into the echo canceller and the output recorded.

At step 1934, the operation may perform calibration to remove near-end echo or other unwanted signal components. In one embodiment this may be considered signal shaping. At a step 1940, the system calculates the time between peaks of the impulse response of the reflection channel. Working from the time between pulses, processing occurs to calculate the distance to line anomalies based on the time at which peaks occur in the impulse response.

This is an exemplary method of operation of the alternative embodiment of sequence time domain reflectometry using echo cancellation techniques. It is contemplated that other methods of processing may be adopted for use with the echo canceller embodiment. The scope of the claims is not intended to be limited to this particular method of operation, but is intended to cover any method of sequence time domain reflectometry utilizing the coefficients of a prediction filter.

While various embodiments of the application have been described, it will be apparent to those of ordinary skill in the art that many more embodiments and implementations are possible that are within the scope of this invention.

Figure 20:
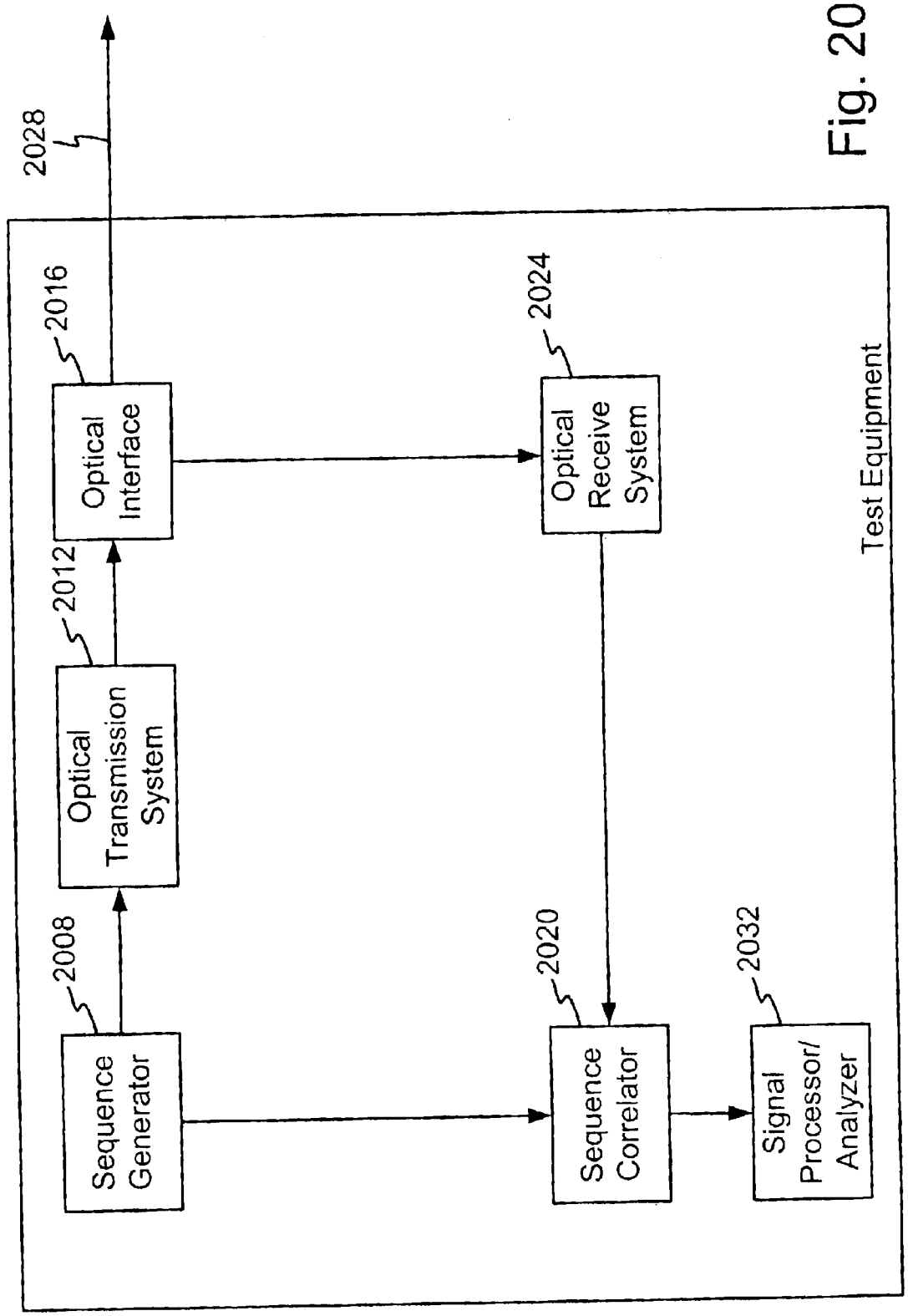
FIG. 20 illustrates a block diagram of an example embodiment of an optical sequence time domain reflectometry system configured as or contained in test equipment.

FIG. 20 illustrates a block diagram of an example embodiment of an optical sequence time domain reflectometry system. The embodiment of FIG. 20 is in an example environment of test equipment 2004. The test equipment 2004 may comprise any type of test equipment configured to perform testing or analysis on a communication channel. In the embodiment shown in FIG. 20 the test equipment is configured to test or analyze an optical fiber for discontinuities, breaks, flaws, improper, dirty or malfunctioning connectors, changes in loss characteristics, unauthorized taps, or poor repairs. Collectively these may be referred to as line anomalies. While it is understood that test equipment 2004 will have numerous components to enable operation, only those relevant to the invention are shown so as not to distract from the invention. Moreover, it is contemplated that the aspects and features of this embodiment may be combined with any or all of the features of the other embodiments and configurations discussed above. Features, method and apparatus that have already been described herein are not described in detail again.

A sequence generator 2008 connects to an optical transmission system 2012 and a sequence correlator 2020. The optical transmission system 2012 connects to an optical interface 2016. The optical interface 2016 outputs the optical signal from the optical transmission system 2012 to an optical fiber 2028 and connects to an optical receive system 2024. The optical receive system 2024 has an output connected to the sequence correlator 2020. The output of the sequence correlator 2020 connects to a signal processor/analyzer 2032. Various user interfaces (not shown) may be included to facilitate use of the test equipment by an operator and for input and output of relevant test data.

Each device is now described in greater detail. The sequence generator 2008 generates or retrieves a sequence signal. The sequence generator 2008 is described above in detail. The sequence signal may be generated or retrieved from memory. The optical transmission system 2012 comprises componentry configured to receive and process the sequence signal for transmission in an optical format. The optical transmission system 2012 also generates and sends an optical signal over an optical fiber 2028 or free space. In one embodiment the optical transmission system 2012 includes an optical generator. The optical interface 2016 is a device configured to receive and direct optical signals to one or more outputs depending on the port through which the signal is received and the configuration of the optical interface. The optical interface 2016 directs the signal received from the optical transmission system 2012 to the fiber 2028 while directing a reflection signal received over the fiber to the optical receive system 2024.

The optical receive system 2024 comprises apparatus to receive the optical reflection signal and convert the optical signal to an electrical signal. The sequence correlator 2020, which in this embodiment also receives the sequence from the sequence generator, comprises apparatus to correlate the reflection signal with the sequence signal that was transmitted over the fiber 2028. The sequence correlator 2020 is described above in detail and accordingly is not described again. The signal processor and/or analyzer 2032 comprises any type processor, ASIC, control logic, digital signal processor, or other computing device configured to analyze the correlated signal to determine one or more points of correlation and perform additional computing as described herein. The fiber 2028 may comprise any type of fiber comprising glass or non-glass fiber or single mode or multi-mode fiber or any other type of medium capable of a light signal or optical signal. Operation of these components is described above and below in more detail.

Figure 21:
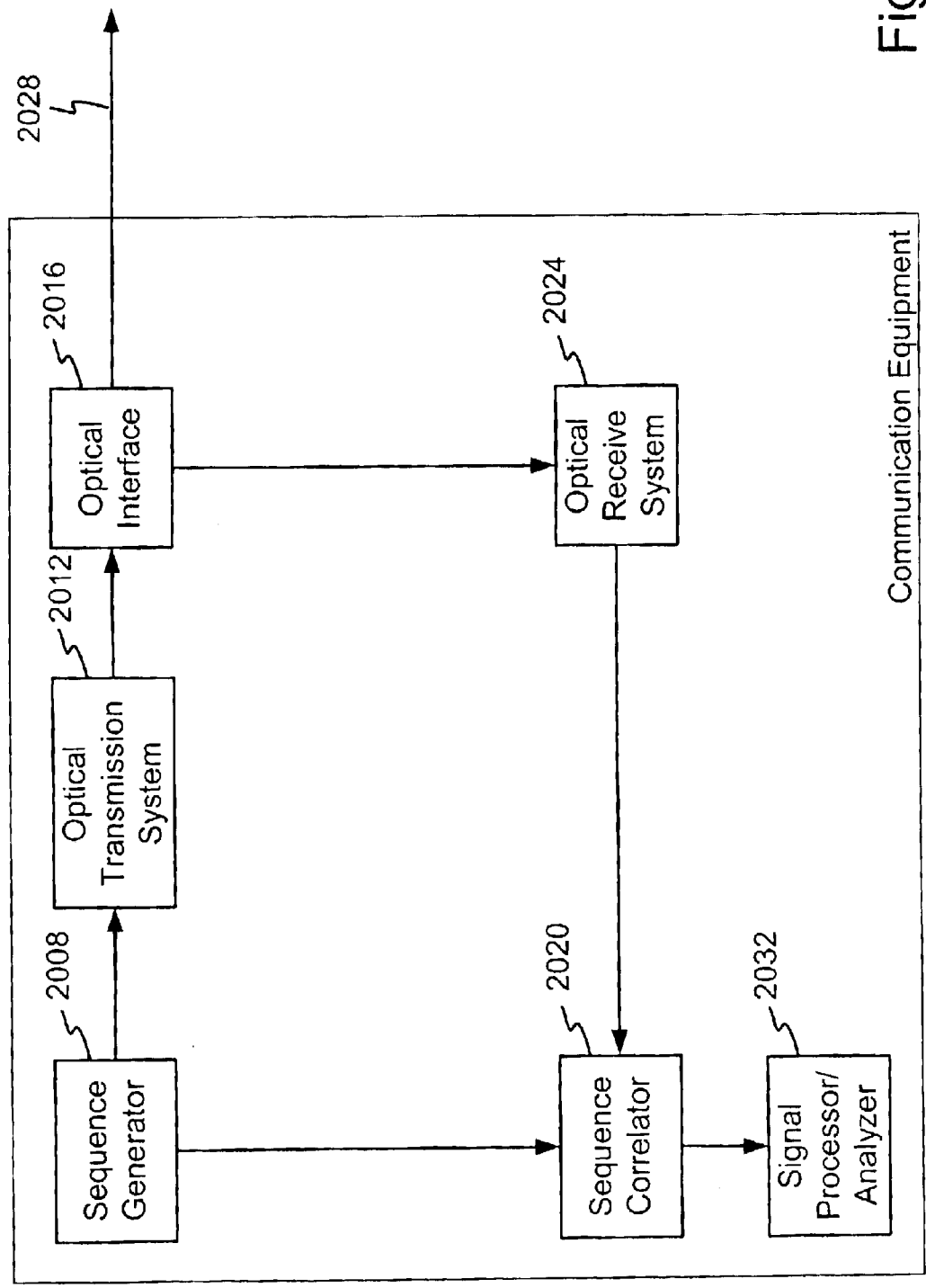
FIG. 21 illustrates a block diagram of an example embodiment of an optical sequence time domain reflectometry system configured as or contained in a communication device.

FIG. 21 illustrates a block diagram of an example embodiment of the invention configured as communication equipment. The internal apparatus of FIG. 21 is similar to that shown in FIG. 20 and hence duplicate apparatus are not described again. The apparatus of FIG. 21 is configured as communication equipment. It is contemplated that the optical sequence time domain reflectometry (STDR) method and apparatus may be configured within test equipment as shown in FIG. 20 or as part of or integral with communication equipment. Providing the STDR system as a part of communication equipment provides the advantage of enabling STDR operation on a line that is intended to be used for communication or that was previously used for communication without having to disconnect the communication and connect test equipment. A further advantage is that additional equipment, such as test equipment, does not have to be purchased since the STDR system is incorporated into the communication system. Moreover, as the STDR system shares some of the same componentry as certain types of communication equipment the cost of adding STDR capability to a communication system may be less than that with a separate embodiment in test equipment.

In an alternative embodiment the correlation is performed in the optical domain, i.e. the reflection is not converted to an electrical signal prior to correlation. In one configuration of such an embodiment an optical AND gate for each element of the N element sequence would provided. In addition, an N-way splitter, N digital integrators and a digital multiplexer would be arranged to achieve optical correlation. Hence, it is contemplated that optical correlation is within the scope of the claims that follow.

Figure 22:
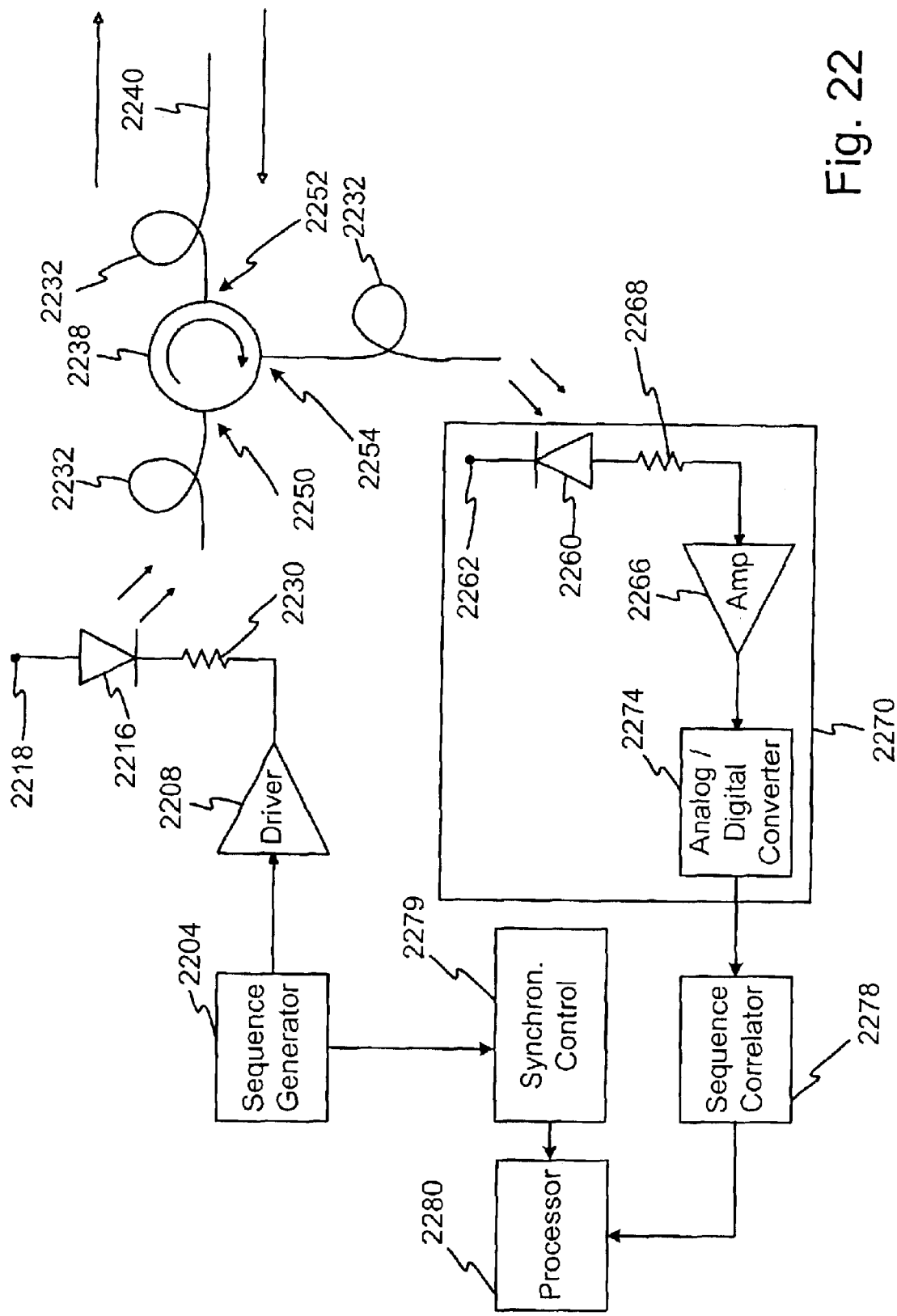
FIG. 22 illustrates a block diagram of an example embodiment of an example implementation of an optical sequence time domain reflectometry system.

FIG. 22 illustrates a block diagram of an example embodiment of a system configured to perform optical sequence time domain reflectometry (Optical STDR). Implementations or configurations other than those shown in FIG. 22 may be embodied without departing from the scope of the invention. In the example embodiment shown in FIG. 22, an m-sequence generator 2204 connects to a driver 2208 and a synchronization control unit 2279. It should be noted that it is understood by one of ordinary skill in the art that additional component and systems would be utilized to achieve operation, however, these additional components and systems are omitted so as to not obscure the invention. The driver 2208 transforms the sequence signal input to a signal with power level and other signal characteristics suitable to drive an optical signal generator 2216. Exemplary drivers 2208 include but are not limited to, an LED driver, a laser driver, external modulator driver, or integral modulator driver, where the laser and driver may be part of a common part of processed single crystalline substrate, or an integrated optical component.

A resistor 2230 or other biasing device may optionally reside between an optical generator 2216 and the driver 2208. The optical generator 2216 connects to a voltage source or current source 2218. The optical generator 2216 may comprise any device capable of transforming the electrical signals from the driver 2208 to optical or light energy. Examples of suitable optical generators 2216 include but are not limited to, an LED driver, a laser driver, external modulator driver, or integral modulator driver, where the laser and driver may be part of a common part of processed single crystalline substrate, or an integrated optical component.

In this embodiment the optical interface comprises a circulator 2238. The circulator 2238 connects to or is positioned to receive the output of the generator 2216. The circulator 2238 comprises a device configured to selectively direct a light signal or a reflection signal to an optical fiber 2240 or toward the receiver systems 2270 that are described below. Optical fiber, a lens system, or other optical signal channeling system 2232 may couple to the circulator 2238. The circulator 2238 includes an input port 2250, an input/output port 2252 that connects to the fiber 2240 and an output port 2254 connects to the receiver systems 2270. The output port 2250 receives the signal from the generator 2216 for transmission through the line. The input/output port 2252 provides the signal to the fiber 2240 and receives the reflection signal from the fiber. The reflection signal exits the circulator 2238 over the output port 2254. The circulator 2238 may be made to reflect a portion of the light signal from the generator 2216 to the fiber 2240 and a portion to the output port 2254.

An optical fiber 2240 or other light conducting medium connects to or is positioned to receive the output of the circulator 2238 or interface 2232. The optical fiber 2240 may comprise any type fiber or medium configured to carry a light or optical signal or it may comprise a lens or other system to facilitate free space optical transmission. It is contemplated that the fiber 2240 comprise a communication channel or other fiber on which the STDR is to be performed to analyze the channel or locate a line anomaly i.e. channel anomaly.

After transmission of a sequence signal on the fiber 2240 a reflection may be generated when the sequence signal encounters a line anomaly. The fiber 2240 conducts the reflection to the circulator 2238 and the circulator diverts or directs the reflection to an optical detector 2260. The optical detector 2260 receives an optical signal and converts the optical signal to an electrical signal. In one embodiment the optical detector 2260 comprises a reverse bias diode or a PIN diode. In other embodiments the optical detector 2260 may comprise any device capable of receiving or detecting an optical signal and converting the optical signal to a corresponding electric signal.

The optical detector 2260 connects to a power source 2262 and an amplifier 2266 as shown. A resistor 2268 or other biasing device may optionally reside between the optical detector 2260 and the amplifier 2266. In one embodiment the amplifier 2266 comprises a current amplifier such as a transimpedance amplifier. In one embodiment the amplifier 2266 comprises a high-speed amplifier capable of operation at greater than 50 MHz. In one embodiment the components within dashed line 2270 comprises or operate in the manner of an automatic gain control unit to provide an output having a desired power or voltage level to subsequent components.

The output of the amplifier 2266 connects an analog to digital convertor 2274 (A/D convertor). The A/D convertor 2274 transforms the analog reflection signal to a digital signal. Any type or resolution of A/D converter may be utilized. It is contemplated that the resolution may range from one bit to twenty-four or more bits. In one exemplary embodiment the A/D converter operates with 14 bits of resolution. In another embodiment the A/D convertor may operate with 5–6 bits of resolution. As the length of the optical fiber increases the magnitude of the reflection decreases. Hence, more resolution, i.e. more bits of resolution, will provide more accuracy or achieve operation when analyzing longer lines.

The output of the A/D convertor 2274 feeds into a sequence correlator 2278 which is configured to correlate the reflection signal received from the summing junction with the original sequence signal generated by the sequence generator 2204 to create a correlated signal. The sequence correlator 2278 is described above in detail and accordingly not described again in great detail. The correlator 2278 outputs the correlated signal to a processor 2280 or other system for analysis. It is contemplated that in one embodiment the sequence correlator is able to obtain or generate the sequence signal as generated by the sequence generator 2204 and/or obtain information from the generator 2204 or other components regarding the sequence signal.

The sequence generator also provides the sequence signal to a synchronization control unit 2279. The embodiment of FIG. 22 adopts a circulator 2238. The circulator does not provide near-end echo to the receiver systems 2270. As a result, other means to establish timing must be provided. In one embodiment synchronization control unit 2279 monitors for the start of the sequence signal or some other reference point. This information is provided to the processor 2280 for purposes of timing so that a time difference between the start of the sequence signal and the receipt of one or more points of correlation may be determined by the processor. As described below, the processor 2280 utilizes the time information from the synchronization control unit 2279 to determine a distances, i.e. location, of a line anomaly. Appropriate adjustment may occur to the timing information to account for delay caused by the driver 2208, generator 2216, and circulator 2238, and receiver systems 2270.

The processor 2280 may comprise any type processor, ASIC, digital signal processor, control logic or combination thereof capable of performing the tasks described herein to achieve STDR. In one embodiment the processor 2280 analyzes the con-elated signal to perform one or more of the following: locate one or more points of correlation, remove near end echo if present, align the correlated signal with a template signal or original sequence signal for timing reference, and/or determine a distance or location of a line anomaly based on the time between the start of the sequence signal, the time of receipt of the reflection signal at the point of correlation and the rate of propagation of the signal through a fiber. It is contemplated that in other embodiments the processor may be configured to perform other operations.

Although the optical STDR system is shown in the exemplary embodiment of a system designed to analyze or test an optical fiber, it is contemplated that the optical STDR system may also be implemented in other configurations to achieve analysis of systems other than an optical fiber. Hence, it is contemplated that the principles and apparatus as described and claimed herein may be utilized to perform optical STDR on other types of systems. Such systems include but are not limited to integrated optical systems, systems or components located on an integrated circuit and systems that connect to an integrated circuit. In addition, such other systems may comprise optical interconnects that connect computers or other electronic devices to an optical network or which connect optical devices. It is anticipated that the optical STDR may detect anomalies within devices to fraction of a millimeter or less.

Figure 23:
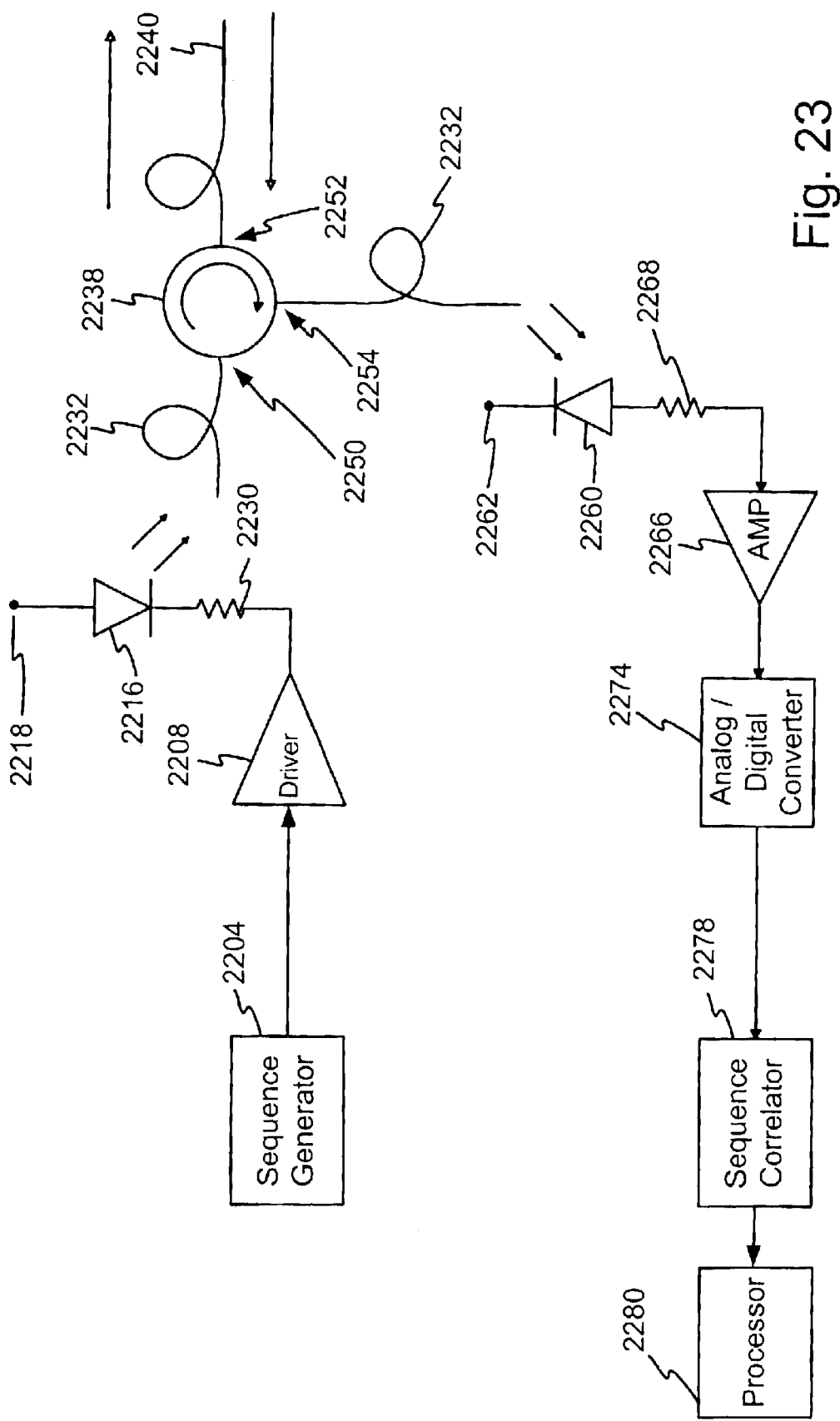
FIG. 23 illustrates a block diagram of an alternative example embodiment of an example implementation of an optical sequence time domain reflectometry system.

FIG. 23 illustrates a block diagram of an alternative embodiment comprising a signal alignment subsystem. As portions of FIG. 23 are identical to portions of FIG. 22, only aspects that differ are discussed below. In one embodiment the circulator 2238 is configured to provide a portion of the transmitted optical sequence signal not only to the optic fiber input/output port 2252 but also to the output port 2254. Thus, in such a configuration a portion of the original sequence signal transmitted over the line passes through the output port 2254. While it is understood that most circulators are configured to provide complete isolation between the transmit port and the receive port, it is contemplated that a circulator could be configured to provide only partial isolation between these ports.

This embodiment, as shown in FIG. 23, is in contemplation that the circulator does not completely isolate the port 2254 from the signal passing from port 2250 to port 2252. Hence, a portion of the sequence signal is transmitted to the optical fiber 2240, and at the time of transmission, a portion also passes to the optical detector 2260. As a result, the time at which start of the sequence occurs can be determined by transmission of the sequence signal. Consequently, the synchronization control unit 2279 and the connection between the sequence generator and processor 2280 via the synchronization control unit 2279, as shown in FIG. 22, may be eliminated in the embodiment of FIG. 23. The processor 2280 will record the start of the sequence signal, which may optionally be correlated, for timing purposes.

Through further processing by the processor 2280 or other device the location of the anomaly or effect that created the reflection may be located o r determined. This is but one alternative embodiment of the reflection signal processing. Other embodiments, which do not depart from the scope of the claims that follow, are contemplated.

Figure 24:
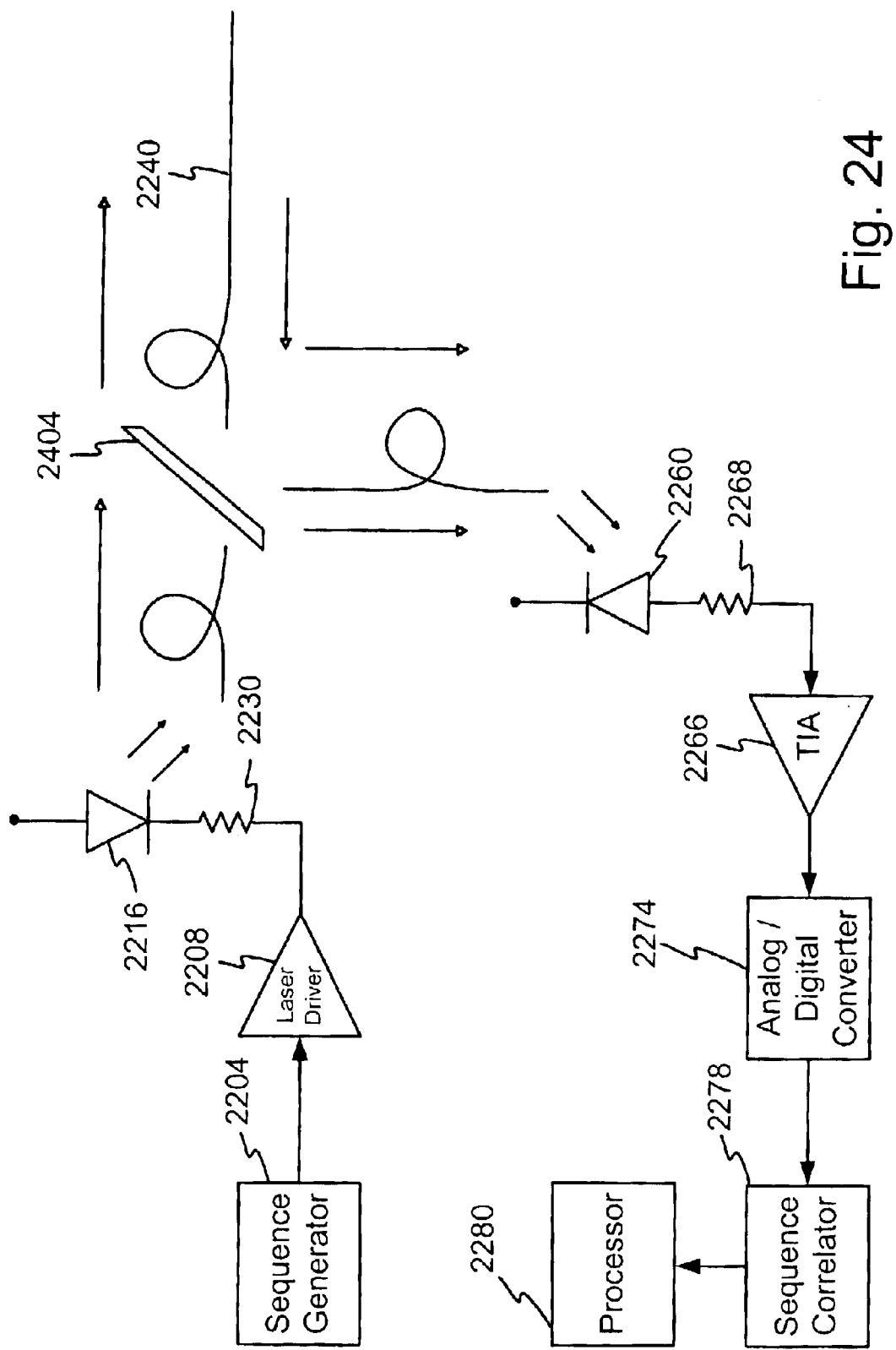
FIG. 24 illustrates a block diagram of an example implementation of an optical sequence time domain reflectometry system equipped with a beam splitter.

FIG. 24 illustrates an alternative embodiment configured with a beam splitter 2404. With respect to FIG. 24 and FIG. 22, similar elements are identified with identical reference numerals. As shown, the optical signal generator 2216 provides an optical output to the beam splitter 2404. In the embodiment shown in FIG. 24, the beam splitter 2404 comprises a device configured to direct a portion of the optical sequence signal to the fiber 2240 and a portion of the optical signal to the optical detector 2260. An isolator (not shown) may reside between the optical generator 2216 and the beam splitter 2404.

The amount or intensity of signal directed to the fiber 2240 in relation to the amount or intensity of signal directed to the detector 2260 may be made to be any ratio or proportion as desired. In one embodiment the beam splitter 2404 splits the signal 50% to the fiber 2240 and 50% to the detector 2260. In another embodiment the beam splitter 2404 splits the signal 90% to the fiber 2240 and 10% to the detector 2260. In the embodiment shown in FIG. 24 the beam splitter 2404 is configured to direct at least a portion of the sequence signal to the detector.

In this embodiment the beam splitter 2404 provides a portion of the generated sequence signal that is being transmitted over the fiber 2240 to the detector as a near-end echo signal. Hence, the receiver componentry has access to the original sequence signal in the form of the near-end echo. Processing on the near end echo, which may be used for timing reference and alignment, may occur as describe above.

Upon receipt of a return reflection signal the beam splitter 2404 directs at least a portion of the reflection signal to the detector 2260. Other embodiments may direct differing percentages of the reflection signal to the detector 2260. The reflection signal may be a weak signal and hence it may be desired to direct as much of the reflection as possible to the detector 2260. The beam splitter 2404 possesses features or characteristics that may make it desirable for use. One such desirable characteristic is that it may cost less than a circulator. Another desirable feature is that it may be made to provide a portion of the sequence signal being transmitted over the line 2240 to the detector 2260 for timing purposes. Other advantages of the beam splitter 2404 over the circulator include ease of integration with a MEMS structure due to the simplicity of manufacturing processes and the similarity of materials in present usage.

Figure 25:
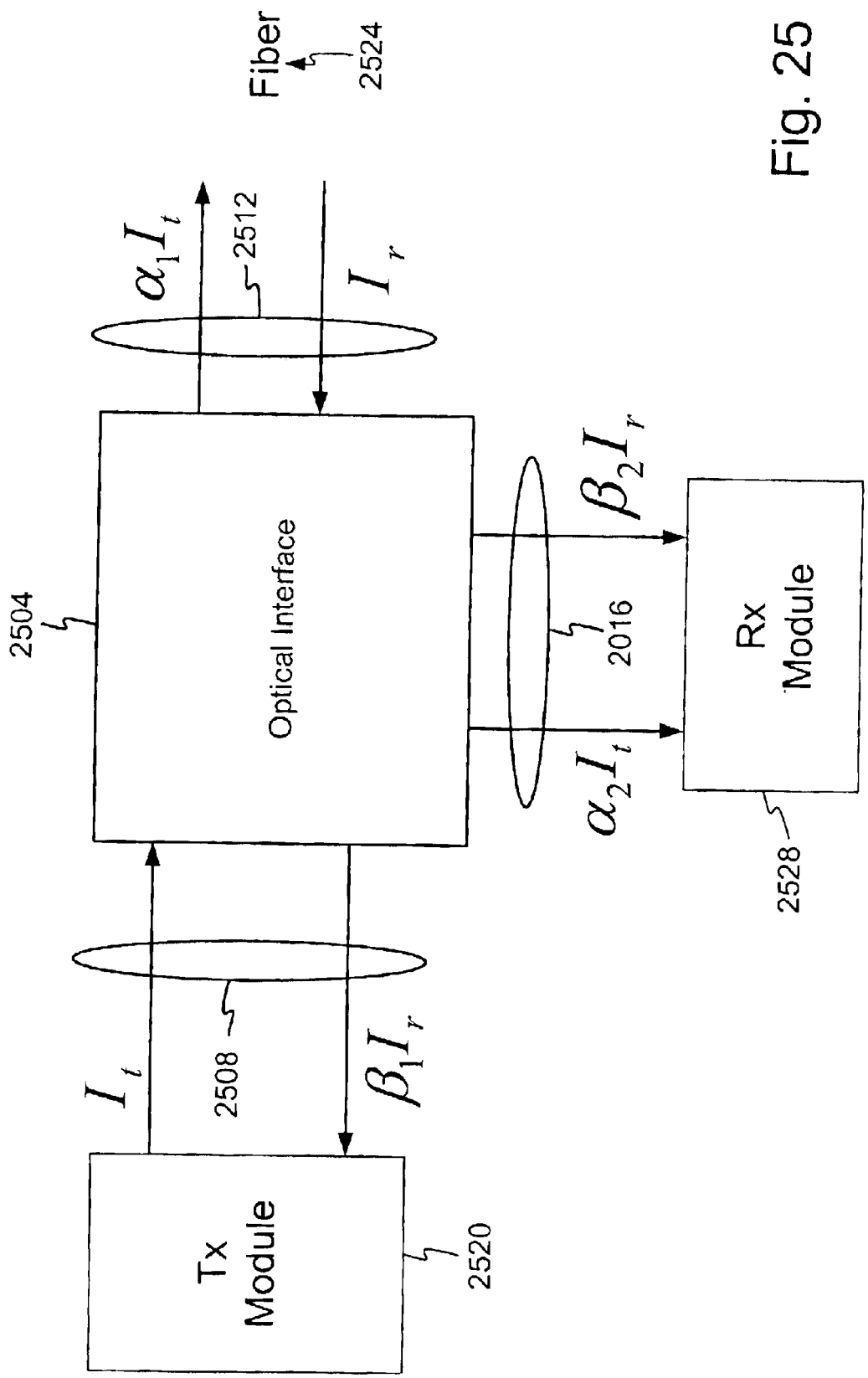
FIG. 25 illustrates a block diagram of a functional representation of an optical interface.

FIG. 25 illustrates a block diagram of an optical interface 2504. The generalized optical interface 2504 is a functional representation of a device capable of directing the generated sequence signal from a signal generator to an optical fiber while directing a reflection received from the optical fiber to the receiver components, such as to an optical detector. From a functional viewpoint, the optical interface 2504 comprises a first port 2508, a second port 2512 and a third port 2516. It is contemplated that for purposes of discussion and understanding the first port receives a signal, such as for example an optical signal, from a transmit module 2520. The second port 2512 may connect or couple to a channel, such as an optical fiber 2524 while the third port 2516 may connect or couple to a receive module 2528, such as an optical detector. It may be desired to fully or partially isolate the signal generator, such as an optical generator, from the receive module, such as an optical detector so that the power level of the transmitted signal does not harm the sensitive receiver module. Hence when a signal is provided through the first port 2508 to the second sport 2512 it may be desired to control the amount of signal that is provided to the third port 2516. Similarly, if a reflection signal is received over a channel or optical fiber by the second port 2512, then it may be desired to direct the reflection signal to the third port 2516 while directing the reflection signal away from the first port 2508.

As shown the first port 2508 may receive a signal represented by $I_t$, where $I_t$ represents the intensity of the transmitted signal. At the optical interface the intensity of the transmitted signal passing out of the second port 2512 is represented as $\alpha_1 I_t$ and the intensity of the signal passing out of the third port 2516 is represented as $\alpha_2 I_t$. The values $\alpha_1$ and $\alpha_2$ represent the percentage of the signal that the optical interface 2504 directs to each of the other ports when presented with a signal from the transmit module 2520.

A reflection signal received at the second port 2512 is represented as $I_r$. After passing through the optical interface 2504, the reflection signal with intensity $\beta_2 I_r$ passes out of the third interface 2516 while the reflection signal having intensity $\beta_1 I_r$ passes out of the first interface 2508. The coefficients $\beta_1$ and $\beta_2$ represent a percentage or an amount of the original intensity of the signal received by the optical interface 2504 that is passing out of a partial port optical interface. In one embodiment, where losses of the optical interface 2504 are ignored, the following equations define a relationship between the coefficients.

$$\alpha_1 + \alpha_2 = 1$$

$$\beta_1 + \beta_2 = 1.$$

In one embodiment where the optical interface comprises a circulator the value $\alpha_2$ is very small. In the embodiment of a 50—50 beam splitter the values for all $\alpha$ and $\beta$ are 0.5. In one embodiment if the value of $\beta_1$ is other than a very small value then an isolator may be required between the transmit module 2520 and the optical interface 2504. If the value of $\alpha_2$ is other than a very small value then an isolator may be required between the receive module and the optical interface 2504. It is contemplated that the value of $\alpha$ and $\beta$ may be made to be any value desired. Amplification may be integrated into the optical interface 2504.

Figure 26:
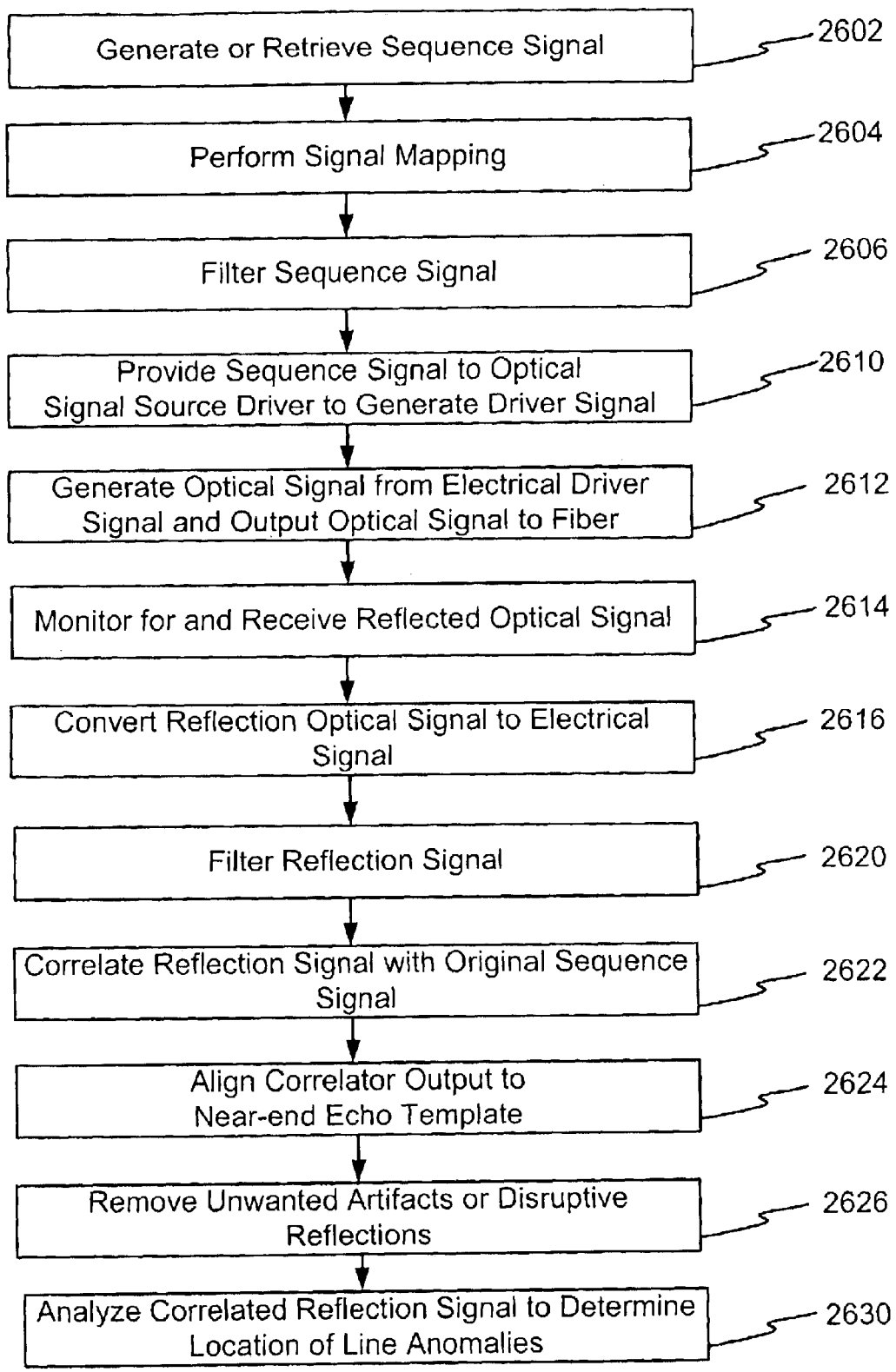
FIG. 26 illustrates an operational flow diagram of an example method of optical sequence time domain reflectometry.

FIG. 26 illustrates a flow diagram of an example method of operation of an optical STDR system. The steps of FIG. 26 may be combined in any combination with the steps of other methods described herein. Certain steps may not be executed. This is but one example embodiment. It is contemplated that other methods of operation are possible and within the scope of the invention as define by the claims. This exemplary method of operation may occur in either communication equipment or test equipment configured to perform STDR. At a step 2602, the sequence time domain reflectometry system (hereinafter system) generates a sequence signal or retrieves a sequence signal from a memory. The sequence signal may comprise an M-sequence or any other type of sequence. In one embodiment, the sequence comprises a sequence with good autocorrelation properties. Various different types or classes of sequence signals may be generated or retrieved from a memory. It is contemplated that a user or the STDR system may generate and use different types of sequence signals. At a step 2604, the operation performs signal mapping to assign the sequence signal to one of several different values. As is understood in the art, the signal mapping occurs when the sequence signal is generated by a sequence generator that generates logic levels. In the event that the sequence is stored and retrieved from memory at the time of use, mapping may not occur since the proper sequence, in a pre-mapped form, would be stored.

At a step 2606, the system filters the signal to remove unwanted components. At a step 2610, the system provides the sequence signal to an optical signal source driver. In one embodiment this comprises providing the sequence signal to a driver that generates a signal that is provided to a laser or LED to create an optical signal. At a step 2612, the system generates an optical signal based on the output from the driver. In one embodiment the signal is generated by a laser. In another embodiment a LED generates the signal. It is contemplated that the signal is provided to the optical fiber or to an interface device, such as a circulator or a beam splitter. The signal is then transmitted over the optical fiber or free space optics. It is understood that transmission of a signal over a channel will generate reflections at points of line anomalies.

Thereafter, at a step 2614, the system monitors for and receives any reflection signals generated by the transmission of step 2612. The reflection signal may be defined as the signal(s) received during a period of time after the transmission of the original sequence signal over the channel. Thus, the reflection signal may actually comprise several periods of no signal and one or more individual echoes created by the sequence signal encountering line anomalies as it travels down the optical channel. The reflection signals created by the sequence signal may be received at different times after transmission.

Upon receipt the reflection signal is converted from an optical format to an electrical format. This occurs at a step 2616. The reflection signal, once in electrical format, may be stored for processing at a later time or processing may continue at step 2620 by filtering the reflection signal to remove signals at unwanted frequencies. At step 2622, the system correlates the reflection signal with the original sequence signal. The correlation may reveal one or more points of correlation within the reflection signal which appear as peaks or points of increased magnitude.

Stated another way, the channel is monitored after the transmission of the sequence signal for a period of time sufficient for any reflections generated by the transmission to be recorded by the monitoring. The reflection signals received during this period of time are converted from the optical to the electrical domain and stored or processed. Correlation occurs at step 2622 using the original sequence signal and any signals recorded during the monitoring period of step 2614. Peaks in the correlated signal occur at the points of time in the monitoring when a reflection from a line anomaly was received.

At a step 2624, the system synchronizes the correlated signal with the start of the sequence. This allows for an identification of a time, in relation to the start of the sequence signal transmission or other reference point, at which points or correlation, i.e. reflections, occur. Hence, the time between when the sequence signal was transmitted and when the reflection was received, i.e. a point of correlation, can be determined. The peak of the near-end echo may serve as the reference time point for this calculation.

At a step 2626, the system removes unwanted artifacts or disruptive reflections. One example of a disruptive artifact is near-end echo. Removal of unwanted artifacts may occur by subtracting a template signal. Thereafter, at a step 2630, the system analyzes the correlated reflection signal to determine the location of line anomalies. This may occur by first processing the reflection signal to determine the time difference between the start of the sequence signal transmission and the peak of a point of correlation of the correlated reflection signal.

In one embodiment utilizing Golay or m-sequences, the relative location of the source equipment or transmitter of the Golay or m-sequences may be obtained from the NEAR-end-echo. Location of the FAULT is usually may be identified from the FAR-end-echo. Identification of the far-end-echo may require elimination of the near-end-echo after the relative location of the source equipment has been obtained from the processed reflection signal. Thus, it is possible to eliminate the near-end-echo source equipment location step.

Next, the time difference may be multiplied by the rate of propagation of the signal through the channel. The rate of propagation of a light signal depends on the type of optical fiber or free space optics that are used for the channel. An optical signal propagates at about 50% of the speed of light while in multimode fiber and at about 80% the speed of light when in single mode fiber. These calculations provide the combined distance to and from the line anomaly using the transmitter or line interface as a reference point. Since the optical sequence signal must travel to the anomaly and return in the form of an echo, the distance value may be divided by two to arrive at a true distance to the anomaly.

It is contemplated that certain communication systems, electronic apparatus, hardware systems, software systems, memory devices, registers, or any other communication oriented device may be unable to accommodate one of the above described sequences. In addition, other systems may be unable to accommodate an odd length sequence, such as an m-sequence, or only accommodate sequences of certain length. By way of example, all m-sequences are of length $2^n-1$ which yields an odd length sequence. If a system is only able to process or store an even length sequence, such as for example, a sequence of length 512 or 1024 points, then an m-sequence or other odd length sequence may not be used. As a drawback, the correlation processing described herein may not be effective.

As a result, it may be desirable to establish operation with a different set class of signals. Based on the disclosure herein, the method and apparatus for line probing may also be performed with complementary sequence pairs in addition to the above described signals or sequences. Examples of complementary sequence pairs comprise Golay codes, multi-level sequences or any set of sequences, or any other type of two or more sequences that can be processed, either before or after correlation, to yield an impulse response. In one embodiment, complementary sequences are any pair of sequences for which the sum of their correlations yields an impulse function. It is contemplated that other sequences may be utilized and combined or processed in any manner of ways to yield a correlated result from which an impulse response may be obtained. Types of processing other than that shown below may occur to obtain a combination that has the impulse response. As discussed below, other types of processing may occur.

For example and in reference to FIG. 4, the sequence correlator 446 or the analysis module 450 may comprise or include memory or registers configured to store the two or more correlated signals. Similarly the analysis module 450 or the sequence correlator 446 may be configured to combine or process the correlated signals as described herein.

Hence, it is contemplated that more than two sequences may be transmitted and processed in any manner to generate a correlated output that can yield an impulse response. Likewise, it is contemplated that inverted sequence pairs may be utilized. Examples of complementary sequences are discussed in more detail in Chapter 13 of the book *Sequence Design for Communication Applications* by P. Fan and M. Darnell, offered by John Wiley Publishing, copyright 1996, which is incorporated in its entirety herein.

That the signals described herein may be utilized may be shown mathematically starting with the known principles for m-sequences. Assuming $$m(n, N)*m(-n)*=\delta(n, N)$$

(Where $m(^Q n)*$ is the time reversed complex conjugate of m(n), and * represents the convolution operator. This is known as correlation. Another note, the correlation doesmay not yield the Kronecker delta function, which is described bellow, but may yield a scaled version of it depending on the period of the m-sequence. Namely, $N\delta(n, N)$!. In the case of the Golay codes and, after correlation the combination may it yields $2N\delta(n, N)$!. In addition, the Kronecker delta function is the discrete counter part of the continuous time Dirac delta function. In this equation m(n) is the m-sequence, which is transmitted intermittently or continuously, and m(n,N) is the periodic repetition of an m-sequence. Thus, the m-sequences have the desirable function that the m-sequence correlated with the periodic repetition of an m-sequence yields the function $\delta(n,N)$ which is a delta function. The delta function is an all zero response with a pulse or unit output at the points of alignment during correlation. This generally occurs every N points, where N is the period. Hence this relationship is of importance, since when this relationship between convolved signals is satisfied, the principles of sequence time domain reflectometry as described above may be realized.

In support of this principle, the received signal may be represented as $$r(n)=t(n)*h(n)$$

wherein r(n) is the received signal, t(n) is the transmitted signal, and h(n) represents the impulse response of the channel. Thus, convolving the transmitted signal with the impulse response of the channel yields the received or reflected signal.

Thereafter, the reflected signal may be correlated with the original m-sequence $$c(n)=t(n)*h(-n)*$$

wherein m(n) represents an m-sequence, to yield the correlation output c(n).

Through substitution and based on the linearity of these equations, $$c(n)=m(n, N)*h(n)*m(-n)*$$

and can be re-written as $$c(n)=h(n)*[m(n, N)*m(-n)]$$

which in turn reduces to $$c(n)=h(n)*S(n,N)$$

This is a periodic impulse train and is thus the periodic extension of the echo channel to the impulse train. Hence, the output of the correlator is the impulse response of the channel that is periodically repeated, which is defined by the following equation:

$$c(n)=h(n, N)$$

From this, it can be seen that m-sequences satisfy the requirement. But there are not any even length sequences that have this property, and hence, for the situation of a system able to only accommodate even length sequences, the m-sequence signal time domain reflectometry may not be an option. This would comprise a drawback, but turning to complementary sequence pairs, it can be shown mathematically that if complementary sequences $g_1(n)$ and $g_2(n)$ are selected and defined as even sequences, i.e., sequences with an even number of points, then these drawbacks are overcome.

Stated mathematically, it can be shown that $$g_1(n,N)*g_1(-n)*\neq \delta(n,N)$$

for any A, which is simply the correlation of two even sequences. This does not equal the delta function and hence lacks an important property necessary for the process described above. However, by combining two even sequences in a desired manner, the correlation of the even sequences may result in the delta function. Hence, $$g_1(n, N)*g_n(-n)+g_2(n, N)*g_2(-n)*=\delta(n, N)$$

Thus, by combining such sequences, the beneficial correlation properties described above may be realized. In one embodiment, the combination comprises an addition of the two complementary code's correlation.

Therefore, in one embodiment, the periodic extension of $g_i$ may be transmitted and correlated with $g_i$ in the receiver.

Thus, the first sequence $g_i$ of a complementary sequence pair is transmitted, received and correlated with itself. This is shown as $$c_1(n) = g_1(n, N) * h(n) * g_1(-n)*$$

where $g_1$ is a first complementary code and h(n) is the impulse response of the channel. Thus, the first complementary code of a complementary pair is transmitted through the channel, and the reflection is correlated with the original sequence signal. The correlation operation on a signal is described above in detail and hence, is not described again. The channel may comprise any channel as described above.

Based on principles of linearity, the equation may be re-written as $$c_1(n) = h(n) * [g_1(n,N) * g_1(-n)]$$

Likewise, this operation may be repeated with the periodic extension $g_2$ and the received reflection is correlated with the originally transmitted sequence $g_2$ in the receiver. Thus, the second sequence $g_2$ of the complementary sequence pair is transmitted, the reflection received and correlated with itself. This is shown as $$c_2(n) = h(n) * [g_2(n,N) * g_2(-n)]$$

where $c_2(n)$ is the second correlated signal created by transmission of the second sequence $g_2$ through the channel and the received reflection is correlated with the original second sequence $g_2$. The process of generating the correlated signal $c_2(n)$ may be considered a second operation to create $$c_2(n) = h(n) * [g_2(n, N) * g_2(-n)*]$$

Through mathematical manipulation of these linear systems, it can be shown that $$c1(n) + c2(n) = h(n) * [g_1(-n) * g_1(-n)*] + h(n) * [g_2(n, N) * g_2(-n)*]$$

which reduces due to linearity to $$c1(n) + c2(n) = h(n) * [g_1(-n) * g_1(-n)* + g_2(n, N) * g_2(-n)*]$$

This equation can be re-written as $$c1(n) + c2(n) = h(n) * \delta(n,N) = h(n, N)$$

by substituting in the complementary sequence correlation property described above. This is the base fundamental relationship discussed above, and thus the resulting summation of the two convolved signal will yield the desired channel information. Thus, this method may be used to determine channel characteristics or any other operation as described herein, even when the system executing such processing may not utilize m-sequences or an odd length sequence.

It is contemplated that the either or both of the complementary codes, i.e., sequences, may be transmitted continuously or periodically. In one embodiment, the complementary codes are transmitted continuously to thereby gain the benefit of easier synchronization and alignment of the signals. As a result, the complex timing issues of when to start monitoring and when to stop monitoring are eliminated, as are complex and large buffers. In such an embodiment, a clean period of the reflection signal, after correlation, may be captured at any point during the continuing transmission. In one embodiment, three sequences are sent and the middle used for correlation. This provides the advantage of a less expensive and less complex timing control system.

Figure 27A:
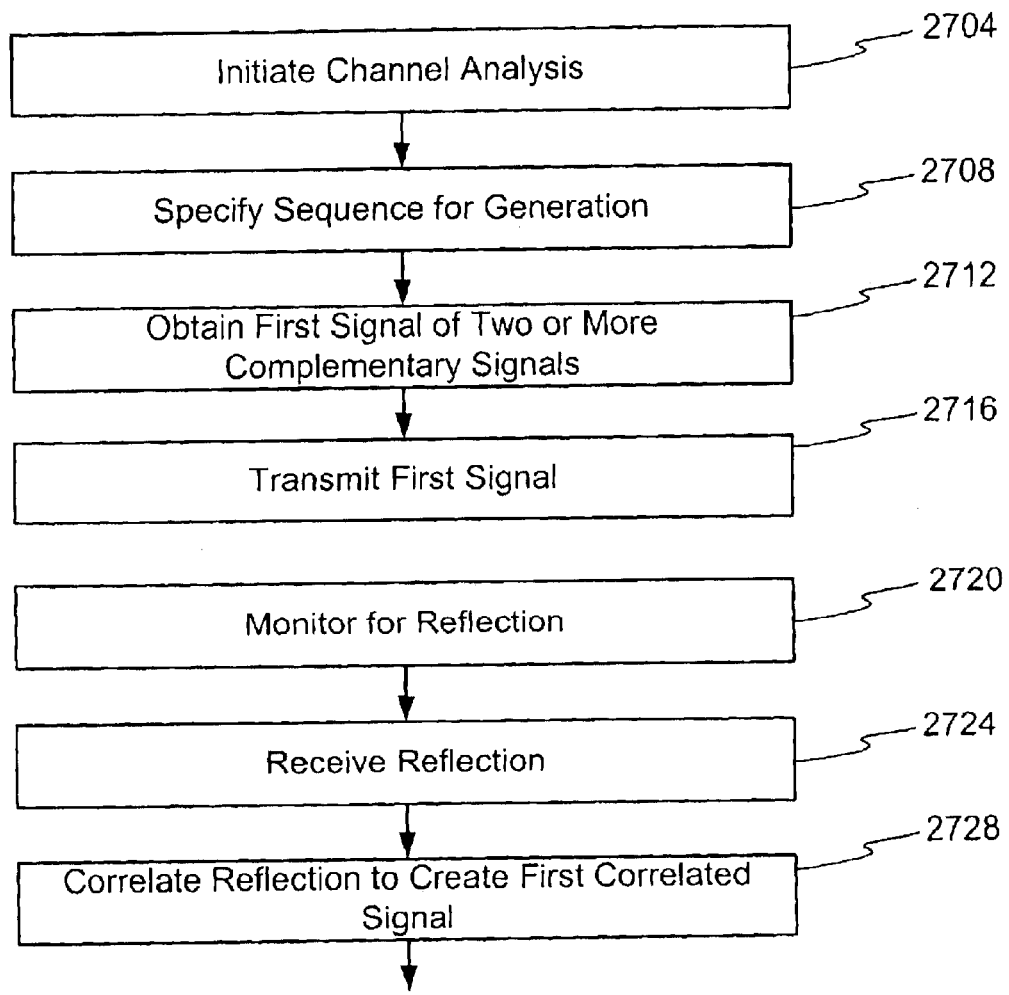
FIGS. 27A and 27B illustrate an operational flow diagram of an example method of operation.
Figure 27B:
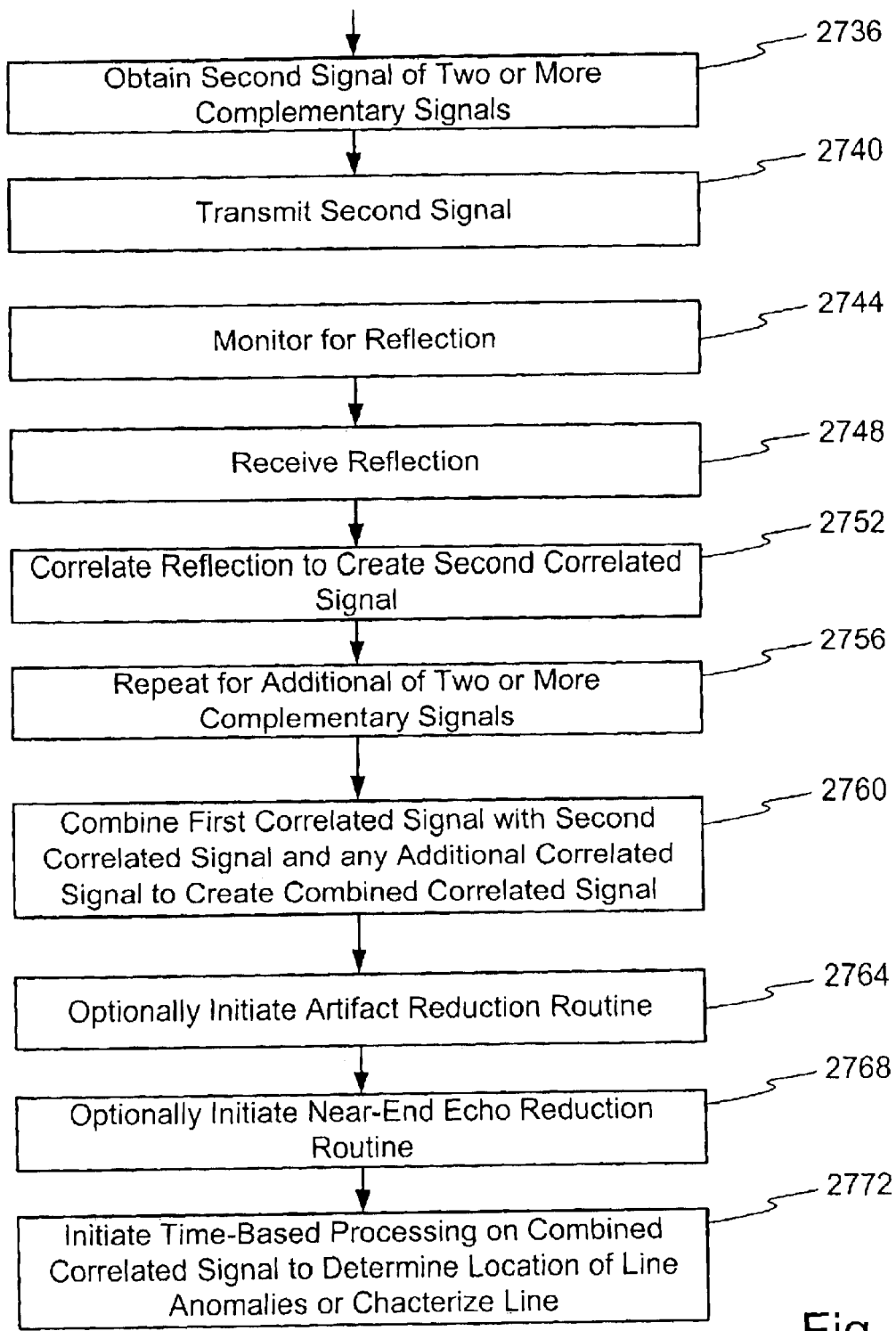

FIGS. 27A and 27B illustrate an operation flow diagram of an example method of operation. This is but one example method of operation, and it is contemplated that other methods of operation may be enabled without departing from the scope of the invention. At a step 2704, the operation initiates a channel analysis operation to characterize the channel and determine if a line anomaly is present or where a line anomaly is located in relation to the point of testing. Thereafter, at a step 2708, the operation specifies a sequence or signal for use in the analysis. In this example embodiment, the signal comprises two or more complementary signal pairs. At a step 2712, the system obtains the first signal of the two or more complementary signals. As discussed above, the signals could be generated or retrieved from memory.

Next, at a step 2716, the system transmits the first signal through the channel, and at a step 2720, the system monitors for and receives, at a step 2724, a first reflection signal generated by the first signal encountering a line anomaly. The signal may be transmitted continuously, and as a result, the reflection signal may be continuously received. Thereafter, at a step 2728, the operation correlates the first reflection signal, with the transmitted first signal, to create a first correlated signal. The correlation operation is discussed above in more detail. The correlated signal may be stored or otherwise saved for use as discussed below.

Turning now to FIG. 27B, at a step 2736, the system obtains the second signal of the two or more complementary signals and at a step 2740 transmits the second signal through the channel. The signal may be transmitted continuously, and as a result, the reflection signal may be continuously received. Thereafter, at steps 2744 and 2748, the system monitors for a reflection and receives a second reflection signal. As a result of the continuous transmission, the reflection may also be received continuously. At a step 2752, the system correlates the second reflection signal, with the transmitted second signal, to generate a second correlated signal. This type of operation may be repeated at step 2756 to generate numerous correlated signals as may be desired to obtain, after processing, at step 2760, a final result having properties of an impulse response. In the particular case of Golay codes, alias embodiment, it is preferred that the two complementary sequence's correlation need to be aligned in time before they are combined through addition.

At a step 2760 of this embodiment, the operation combines the first correlated signal with the second correlated signal and any additional correlated signals generated at step 2756. In one embodiment, the combination comprises adding the two or more correlated signals to obtain a result that approximates a delta function as described above. Thus, through the combination of the correlated reflections of two or more transmitted signals, a combined or processed signal may be generated that has behavior or characteristics of a delta function. Thus, the combined correlated signal behaves or is similar to the response of a correlation of a reflected or correlated m-sequence. Hence, systems or software that are unable to transmit m-sequences, the previously described types of signals, or odd length sequences may now be accommodated using a combination of signals. When transmitted, the signals generate a reflection that can be correlated and processed, and output and have an impulse response of the channel plus reflections and noise.

At a step 2764, the system may optionally initiate artifact reduction on the resulting signal. It should be noted that the combination of the complementary sequences correlation is the correlation artifact reduction in the Golay complementary codes case. At a step 2768, a near-end echo reduction routine may optionally be initiated. At step 2772, the operation initiates processing on the combined correlated signal to determine the location of the line anomalies or to characterize the line. The various aspects of step 2772 are discussed above, and hence are not described again.

While various embodiments of the invention have been described, it will be apparent to those of ordinary skill in the art that many more embodiments and implementations are possible that are within the scope of this invention.

What is claimed is:

1. A method for performing time domain reflectometry on a communication channel comprising:

obtaining a first complementary signal;

transmitting the first complementary signal over a communication channel;

receiving a first reflection signal from the communication channel in response to the transmitting of the first complementary signal;

correlating the first reflection signal with the first complementary signals to generate a first correlated signal;

obtaining a second complementary signal;

transmitting the second complementary signal over a communication channel;

receiving a second reflection signal from the communication channel in response to the transmitting of the second complementary signal;

correlating the second reflection signal with the second complementary signal to generate a second correlated signal;

processing the first correlated signal and the second correlated signal to generate a combined correlated signal;

determining a point of alignment between the transmitted signals and the combined correlated signal;

measuring a time interval between the point of alignment and a subsequent peak in the combined correlated signal; and multiplying the time interval by the rate of propagation of the sequence signal through the communication channel to obtain distance information regarding a line anomaly.

2. The method of claim 1, wherein a peak in the combined correlated signal is caused by a bridge tap.

3. The method of claim 1, wherein the communication channel comprises a twisted pair conductor.

4. The method of claim 1, wherein transmitting the first and second complementary signals occurs at a power level that does not introduce crosstalk into other communication channels.

5. The method of claim 1, further comprising performing a circular rotation of the complementary signals to create two or more rotated complementary signals;

transmitting the two or more rotated complementary signals over the communication channel;

receiving two or more rotated reflection signals;

correlating the two or more rotated reflection signals with the two or more rotated sequence signals to create two or more rotated correlated signals;

aligning the two or more rotated correlated signals with the two or more correlated signals; and adding the two or more rotated correlated signals to the two or more correlated signals to reduce or remove correlation artifacts on the two or more correlated signals.

6. The method of claim 1, further comprising:

retrieving a template signal;

aligning the template signal and the combined correlated signal; and subtracting the template signal from the combined correlated signal to remove near-end echo from the combined correlated signal.

* * * * *

UNITED STATES PATENT AND TRADEMARK OFFICE
CERTIFICATE OF CORRECTION

PATENT NO.   : 6,885,954 B2
DATED        : April 26, 2005
INVENTOR(S)  : Keith R. Jones et al.

It is certified that error appears in the above-identified patent and that said Letters Patent is hereby corrected as shown below:

Column 3,
Line 6, "n ear-end" should be -- near-end --
Line 22, "a nomalies" should be -- anomalies --
Line 60, "n ear-end" should be -- near-end --

Column 19,
Line 2, "t he" should be -- the --

Column 23,
Line 27, "a n" should be -- an --

Column 30,
Line 48, "con-elated" should be -- correlated --

Column 31,
Line 38, "o r" should be -- or --

Column 35,
Line 50, "bellow" should be -- below --

Column 36,
Line 29, "c(n)=h(n)*S(n,N)" should be -- $c(n)=h(n)*\delta(n,N)$ --
Line 60, "$g_1(n,N)*g_a(-n)+g_2(n,N)*g_2(-n)*=\delta(n,N)$" should be
-- $g_1(n,N)*g_1(-n)+g_2(n,N)*g_2(-n)*=\delta(n,N)$ --
Line 67, "gi" should be -- $g_1$ --

UNITED STATES PATENT AND TRADEMARK OFFICE
CERTIFICATE OF CORRECTION

PATENT NO.   : 6,885,954 B2
DATED        : April 26, 2005
INVENTOR(S)  : Keith R. Jones et al.

It is certified that error appears in the above-identified patent and that said Letters Patent is hereby corrected as shown below:

<u>Column 37,</u>

Line 1, "gi" should be -- $g_1$ --

Line 41, "$c1(n)+c2(n)=h(n)*[g_1(-n)*g_1(-n)*g_2(n,N)*g_2(-n)*]$" should be
-- $c1(n)+c2(n)=h(n)*[g_1(n,N)*g_1(-n)*g_2(n,N)*g_2(-n)*]$ --

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,885,954 B2  
APPLICATION NO. : 10/465064  
DATED : April 26, 2005  
INVENTOR(S) : Keith R. Jones et al.

Page 1 of 1

It is certified that error appears in the above-identified patent and that said Letters Patent is hereby corrected as shown below:

Column 35, line 46, "(where m($^Q_N$)*", should be --(where m(-n)*--

Signed and Sealed this

Ninth Day of January, 2007

JON W. DUDAS  
*Director of the United States Patent and Trademark Office*